(12) United States Patent
Pagani et al.

(10) Patent No.: US 9,887,165 B2
(45) Date of Patent: Feb. 6, 2018

(54) IC WITH INSULATING TRENCH AND RELATED METHODS

(71) Applicant: STMICROELECTRONICS S.r.l., Agrate Brianza (IT)

(72) Inventors: Alberto Pagani, Nova Milanese (IT); Giovanni Girlando, Catania (IT); Federico Giovanni Ziglioli, Pozzo d'adda (IT); Alessandro Finocchiaro, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 82 days.

(21) Appl. No.: 14/565,934

(22) Filed: Dec. 10, 2014

(65) Prior Publication Data

US 2016/0172311 A1    Jun. 16, 2016

(51) Int. Cl.
| H01L 23/00 | (2006.01) |
| H01L 23/58 | (2006.01) |
| G01R 31/28 | (2006.01) |
| H01L 21/66 | (2006.01) |

(52) U.S. Cl.
CPC ........ H01L 23/562 (2013.01); G01R 31/2872 (2013.01); H01L 23/585 (2013.01); *H01L 22/14* (2013.01); *H01L 2924/0002* (2013.01)

(58) Field of Classification Search
None
See application file for complete search history.

(56) References Cited

U.S. PATENT DOCUMENTS

| 3,572,109 | A | 3/1971 | Yerman |
| 4,320,664 | A | 3/1982 | Rehn et al. |
| 4,777,826 | A | 10/1988 | Rud, Jr. et al. |
| 5,090,254 | A | 2/1992 | Guckel et al. |
| 5,094,973 | A | 3/1992 | Pang |
| 5,329,823 | A | 7/1994 | Sonderegger et al. |
| 5,834,646 | A | 11/1998 | Kvisteroy et al. |
| 6,300,223 | B1 | 10/2001 | Chang et al. |
| 6,700,174 | B1 | 3/2004 | Miu et al. |
| 6,873,088 | B2 | 3/2005 | Skotnicki et al. |
| 6,879,023 | B1 * | 4/2005 | Gutierrez ............ H01L 23/562 257/373 |
| 6,950,767 | B2 | 9/2005 | Yamashita et al. |

(Continued)

FOREIGN PATENT DOCUMENTS

| CN | 101932944 A | 12/2010 |
| CN | 205248263 U | 5/2016 |

OTHER PUBLICATIONS

Bethe, "The Scope of the Strain Gage Principle," IEEE, 1989, pp. 31-38.

(Continued)

*Primary Examiner* — Paresh Patel
(74) *Attorney, Agent, or Firm* — Slater Matsil, LLP

(57) ABSTRACT

An IC may include a semiconductor substrate having circuitry formed in the substrate, an interconnect layer above the semiconductor substrate and having an antenna coupled to the circuitry, and a seal ring around a periphery of the interconnect layer. The IC may include an electrically insulating trench extending vertically into the semiconductor substrate and extending laterally across the semiconductor substrate from adjacent one side to adjacent another side.

22 Claims, 33 Drawing Sheets

(56) References Cited

U.S. PATENT DOCUMENTS

| | | | |
|---|---|---|---|
| 7,021,147 | B1 | 4/2006 | Subramanian et al. |
| 7,117,742 | B2 | 10/2006 | Kim |
| 7,377,179 | B2 | 5/2008 | Anderson |
| 7,400,255 | B2 | 7/2008 | Horch |
| 7,528,724 | B2 | 5/2009 | Horch |
| 7,536,912 | B2 | 5/2009 | Kim |
| 7,698,949 | B2 | 4/2010 | Akdeniz et al. |
| 7,847,667 | B2 | 12/2010 | Kinget et al. |
| 7,951,675 | B2 | 5/2011 | Xue et al. |
| 8,378,346 | B2 | 2/2013 | Pagani |
| 8,438,931 | B2 | 5/2013 | Kazama et al. |
| 8,933,541 | B2 * | 1/2015 | Kato ............... H01L 23/585 257/622 |
| 8,933,567 | B2 * | 1/2015 | Bang ............... H01L 23/564 257/758 |
| 2002/0030242 | A1 | 3/2002 | Wong |
| 2002/0033283 | A1 | 3/2002 | Miura et al. |
| 2002/0066592 | A1 * | 6/2002 | Cheng ............... H01L 23/552 174/260 |
| 2003/0113981 | A1 | 6/2003 | Combi et al. |
| 2004/0195650 | A1 * | 10/2004 | Yang ............... H01L 27/08 257/531 |
| 2004/0229442 | A1 | 11/2004 | Choi |
| 2007/0025823 | A1 | 2/2007 | Hockersmith |
| 2008/0023793 | A1 * | 1/2008 | Yamazaki ........ G06K 19/07749 257/532 |
| 2008/0229841 | A1 | 9/2008 | Matsukawa et al. |
| 2009/0071260 | A1 | 3/2009 | Speldrich |
| 2009/0152669 | A1 * | 6/2009 | Xue ............... H01L 21/76224 257/506 |
| 2009/0153158 | A1 | 6/2009 | Dunn et al. |
| 2009/0243034 | A1 * | 10/2009 | Stribley ............ H01L 23/5227 257/531 |
| 2013/0341742 | A1 | 12/2013 | Brosh |
| 2013/0342186 | A1 | 12/2013 | Pagani et al. |
| 2014/0054721 | A1 * | 2/2014 | Nam ............... H01L 29/78 257/401 |
| 2016/0103035 | A1 | 4/2016 | Pagani |
| 2016/0172311 | A1 | 6/2016 | Pagani et al. |
| 2016/0223444 | A1 | 8/2016 | Pagani et al. |

OTHER PUBLICATIONS

Huff et al., "Design of Sealed Cavity Microstructures Formed by Silicon Wafer Bonding," Journal of Microelectromechanical Systems, vol. 2, No. 2, Jun. 1993, pp. 74-81.

Lisec et al., "Surface Micromachined Piezoresistive Pressure Sensors with Step-Type Bent and Flat Membrane Structures," IEEE Transactions on Electron Devices, vol. 43, No. 9, Sep. 1996, pp. 1547-1552.

Lin et al., "Design, Optimization and Fabrication of Surface Micromachined Pressure Sensors," Mechatronics 8, 1998, pp. 505-519.

Suhling et al., "Silicon Piezoresistive Stress Sensors and Their Application in Electronic Packaging," IEEE Sensors Journal, vol. 1, No. 1, Jun. 2001, pp. 14-30.

Jiang et al., "Reducing Silicon-Substrate Parasitics of On-Chip Transformers," IEEE 2002, pp. 649-652.

Jiang et al., "Fabrication of Thick Silicon Dioxide Sacrificial and Isolation Blocks in a Silicon Substrate," Journal of Micromechanics and Microengineering 12, 2002, pp. 87-95.

Parameswaran et al., "Sealed-Cavity Microstructure Using Wafer Bonding Technology," The 7th International Conference on Solid-State Sensors and Actuators, Feb. 25, 2002, pp. 274-277.

Iliescu et al., "Low Cost Wafer Level Packaging of MEMS Devices," IEEE, Electronics Packaging Technology Conference, 2003, pp. 287-290.

Du et al., Single Crystal SiC Capacitive Pressure Sensor at 400 degrees C, EECS Department, Case Western Reserve University, Cleveland, Ohio, Oct. 15, 2003, 4 pages.

Sinaga et al., "Circuit Partitioning and RF Isolation by Through-Substrate Trenches," IEEE, 2004 Electronic Components and Technology Conference, pp. 1519-1523.

Kuo et al., "Packaging of Micro Strain Sensors," Department of Electrical Engineering and Computer Science, Case Western Reserve University, Cleveland, Ohio, IEEE, 2004, pp. 546-549.

Mohan et al., "Piezoresistive MEMS Pressure Sensor and Packaging for Harsh Oceanic Environment," IEEE, 2004 Electronic Components and Technology Conference, pp. 948-950.

Ehrlich, Jr. et al., State Highway Administration Research Report, Smart Aggregate Sensor Suite for Bridge Deck Measurements, Phase 1, Mar. 2004, pp. 1-34.

Chong et al., "High-Performance Inductors Integrated on Porous Silicon," IEEE Electron Device Letters, vol. 26, No. 2, Feb. 2005, pp. 93-95.

Raieszadeh, "High-Q Integrated Inductors on Trenched Silicon Islands," Thesis, Georgia Institute of Technology, Apr. 2005, pp. 1-81.

Lammel et al., "Next Generation Pressure Sensors in Surface Micromachining Technology," The 13th International Conference on Solid-State Sensors, Actuators and Microsystems, Seoul, Korea, Jun. 5-9, 2005, pp. 35-36.

Liu, "Chapter 6—Piezoresistive Sensors," Jun. 25, 2005, pp. 207-244.

Suni et al., "Silicon-on-Insulator Wafers with Buried Cavities," Journal of the Electrochemical Society, vol. 153, No. 4, 2006, pp. G299-G303.

Wang et al., "Micromachined CMOS LNA and VCO by CMOS-Compatible ICP Deep Trench Technology," IEEE Transactions on Microwave Theory and Techniques, vol. 54, No. 2, Feb. 2006, pp. 580-588.

Park et al., "A Self-Contained Active Sensor System for Health Monitoring of Civil Infrastructures," IEEE Sensors 2006, pp. 798-802.

Konno et al., "A Highly Sensitive Strain Sensor Using Surface Acoustic Wave and Its Evaluation for Wireless Battery-less Sensor Network," IEEE Sensors 2007 Conference, pp. 796-799.

Bhat, "Silicon Micromachined Pressure Sensors," Journal of the Indian Institute of Science, vol. 87:1, Jan.-Mar. 2007, pp. 115-131.

Ferri et al., "A Packaging Technique for Silicon MEMS Strain Sensors on Steel," IEEE Sensors 2008 Conference, pp. 1524-1527.

Rais-Zadeh et al., "High Performance Inductors on CMOS-Grade Trenched Silicon Substrate," IEEE Transactions on Components and Packaging Technologies, vol. 31, No. 00, 2008, pp. 126-134.

Shaw et al., "Package Design of Pressure Sensors for High Volume Consumer Applications," 2008 Electronic Components and Technology Conference, pp. 834-840.

Mohammed et al., High Sensitivity MEMS Strain Sensor: Design and Simulation, Sensors 2008, 8 pages 2642-2661.

Barlian et al., "Review: Semiconductor Piezoresistance for Microsystems," Proc IEEE Inst Electr Electron Eng. 2009, 97(3), pp. 1-91.

Every et al., "Embedded Sensors for Life-Time Monitoring of Concrete," 4th International Conference on Structural Health Monitoring on Intelligent Infrastructure (SHMII-4) 2009, Jul. 22-24, 2009, Zurich Switzerland, pp. 1-9.

"How to Measure Absolute Pressure Using Piezoresistive Sensing Elements," Jul. 2009, pp. 1-6.

Shi et al., "Piezoresistive Pressure Sensors Based on System in Packaging Technology of MEMS," 2010 11th International Conference on Electronic Packaging Technology & High Density Packaging, 2010 IEEE, pp. 1337-1341.

Fassler, Studies on Mechatronics, Force Sensing Technologies, Spring Term 2010, pp. 1-41.

Yi et al., "Passive Wireless Smart-Skin Sensor Using RFID-Based Folded Patch Antennas," School of Civil and Environmental Engineering and School of Electrical and Computer Engineering, Georgia Institute of Technology, Atlanta, GA, Nov. 28, 2010, pp. 1-18.

Sinaga, "Substrate Crosstalk Suppression Using Wafer-Level Packaging: Metalized Through-Substrate Trench Approach," Sep. 12, 2010, pp. 1-159.

(56) References Cited

OTHER PUBLICATIONS

Santana et al., "A 3-Axis Accelerometer and strain Sensor System for Building Integrity Monitoring," 1. Mechnical/Physical Sensors and Microsystems, 2 pages.

"A Feasibility Study on Embedded Micro-Electromechanical Sensors and Systems (MEMS) for Monitoring Highway Structures," National Concrete Pavement Technology Center, Final Report, Iowa State University, Jun. 2011, pp. 1-86.

Mohammed et al., "Development and Experimental Evaluation of a Novel Piezoresistive MEMS Strain Sensor," IEEE Sensors Journal, vol. 11, No. 10, Oct. 2011, pp. 2220-2232.

Lou et al., "Characterization of a Multi-Layered MEMS Pressure Sensor Using Piezoresistive Silicon Nanowire Within Large Measurable Strain Range," IEEE, 2012, NEMS 2012, Kyoto, Japan, Mar. 5-8, 2012, pp. 99-103.

Wang et al., "A Wireless, Battery-Free Sensor for Strain and Crack Monitoring," SPIE, Newsroom, Oct. 9, 2012, 2 pages.

Studor, "Passive Wireless Sensor Technology (PWST) for Buildings and Extreme Environments" 2012 Future of Instrumentation International Workshop, Gatlinburg, TN, Oct. 9, 2012, pp. 1-115.

Khoo et al., "Enhancement of Silicon-Based Inductor Q-Factor Using Polymer Cavity," IEEE Transactions on Components, Packaging and Manufacturing Technology, vol. 2, No. 12, Dec. 2012, pp. 1973-1979.

Wang et al., "Miniaturized Wireless Sensor Node for Earthquake Monitoring Applications," 7th IEEE International Symposium on Industrial Embedded Systems (SIES '12), IEEE, 2012, pp. 323-626.

Torfs et al., "Low Power Wireless Sensor Network for Building Monitoring," IEEE Sensors Journal, vol. 13, No. 3, Mar. 2013, pp. 909-915.

Burghartz, "Progress in RF Inductors on Silicon—Understanding Substrate Losses," IBM Research Division, T. J. Watson Research Center, Yorktown Heights, NY, Jul. 21, 2014, 4 pages.

Lee et al., "Fabrication of Capacitive Absolute Pressure Sensor Using Si—Au Eutectic Bonding in SOI Wafer," Journal of Physics: Conference Series 34, 2006, pp. 393-398.

Guomin et al., "A Design of Wireless Bridge Stress Sensor," 2011 Fourth International Conference on Intelligent Computation Technology and Automation, pp. 327-332.

A. Motta, U.S. Appl. No. 14/754,788, filed Jun. 30, 2015.

* cited by examiner

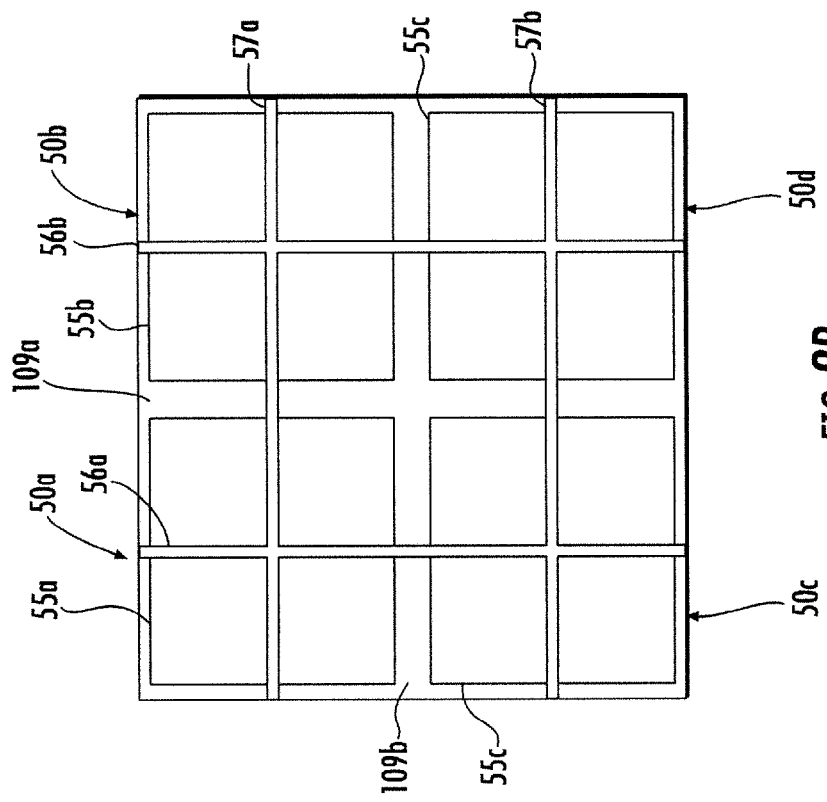
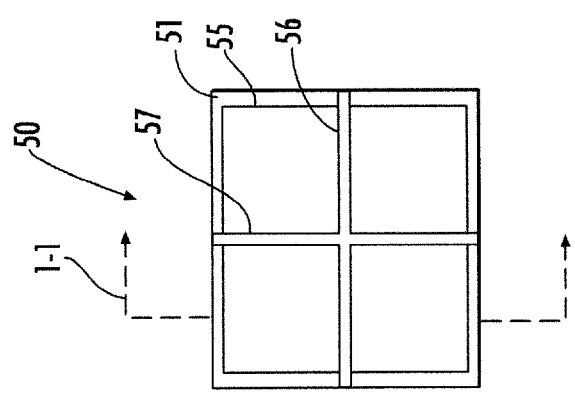

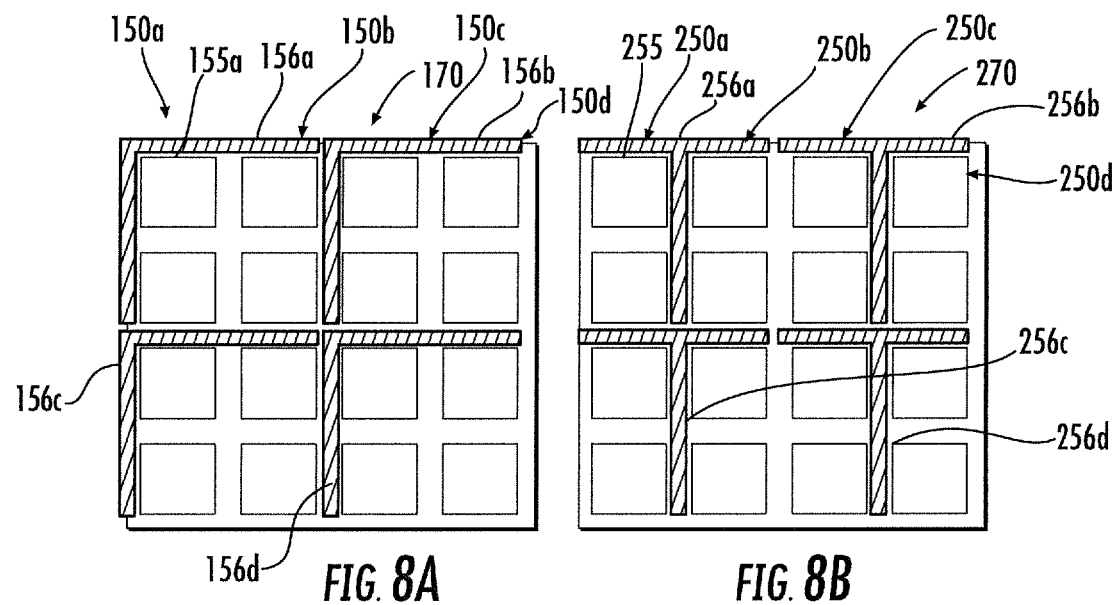
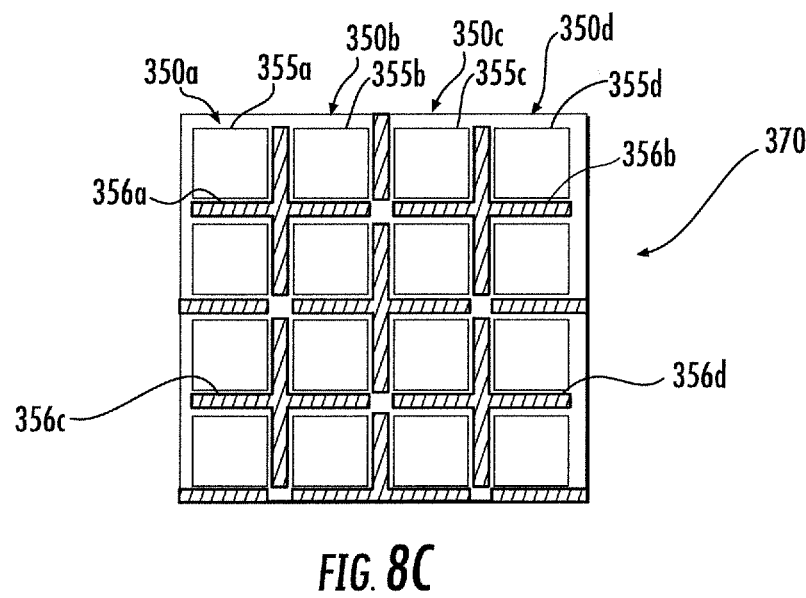

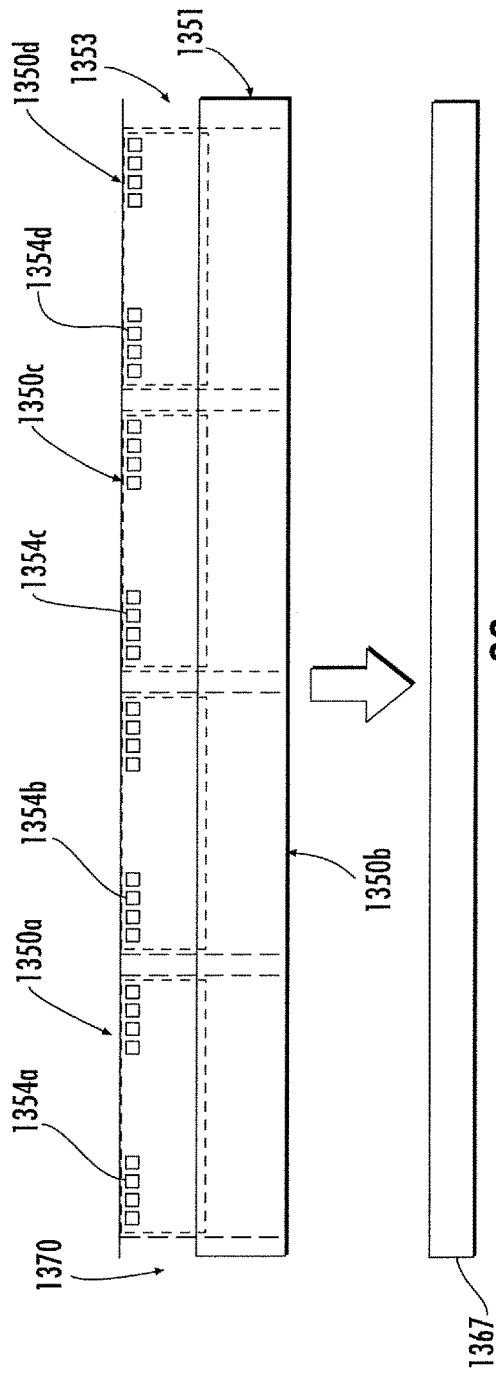
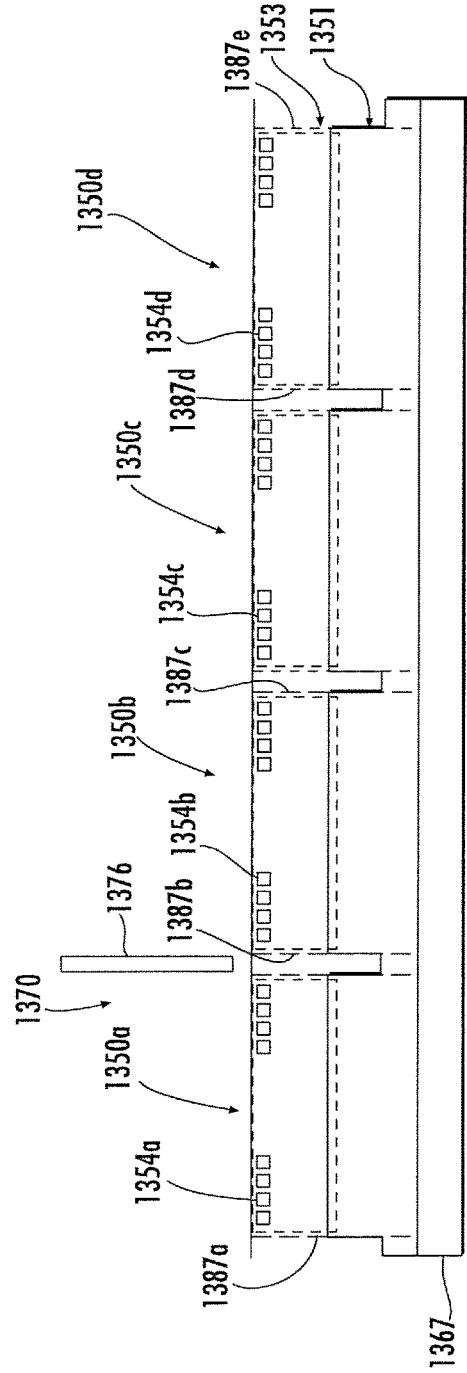
FIG. 28
FIG. 29

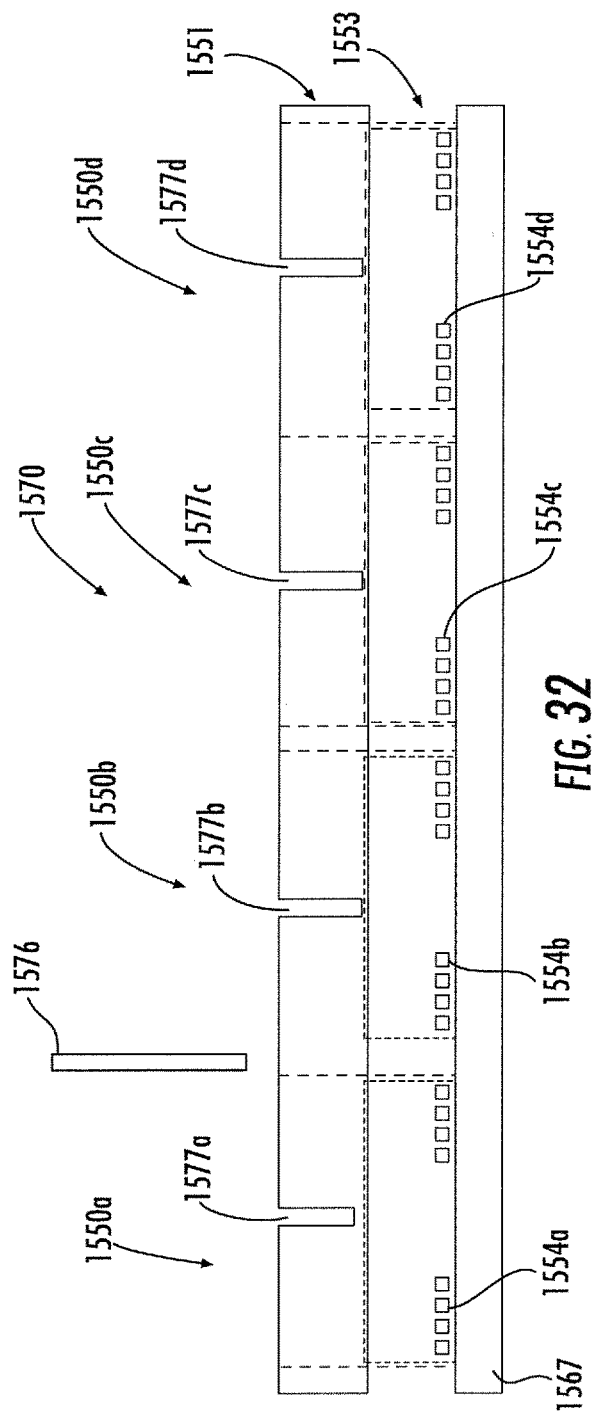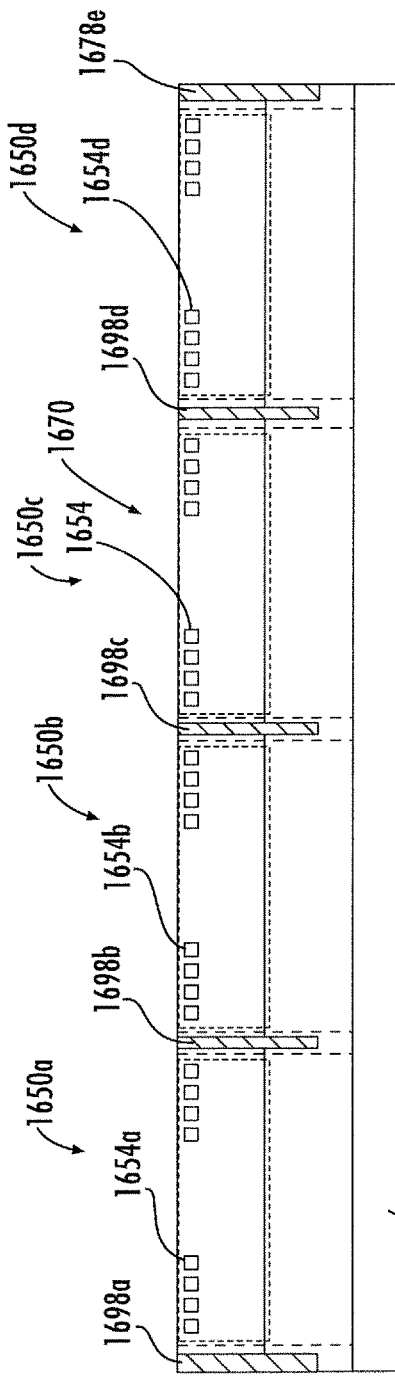

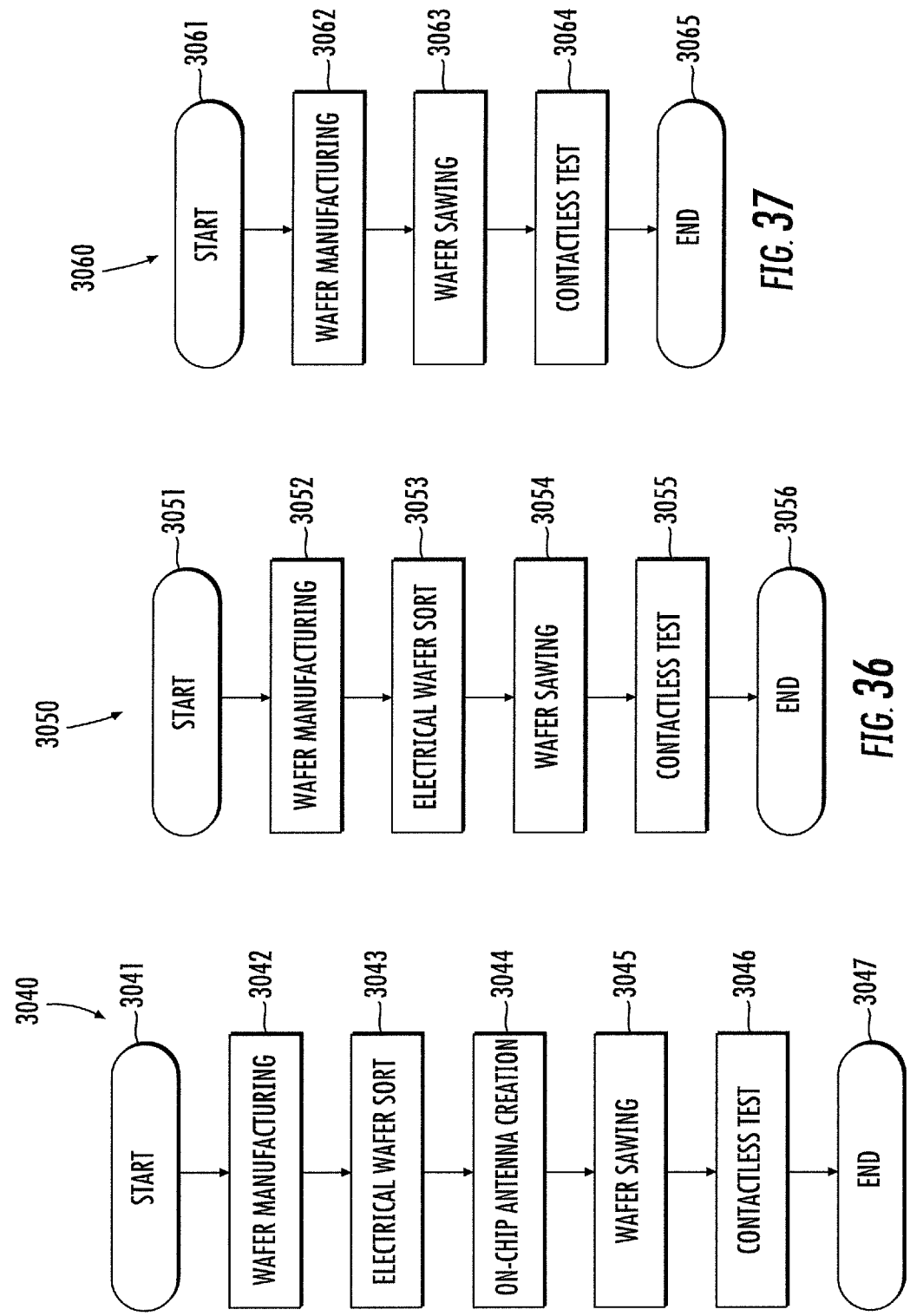

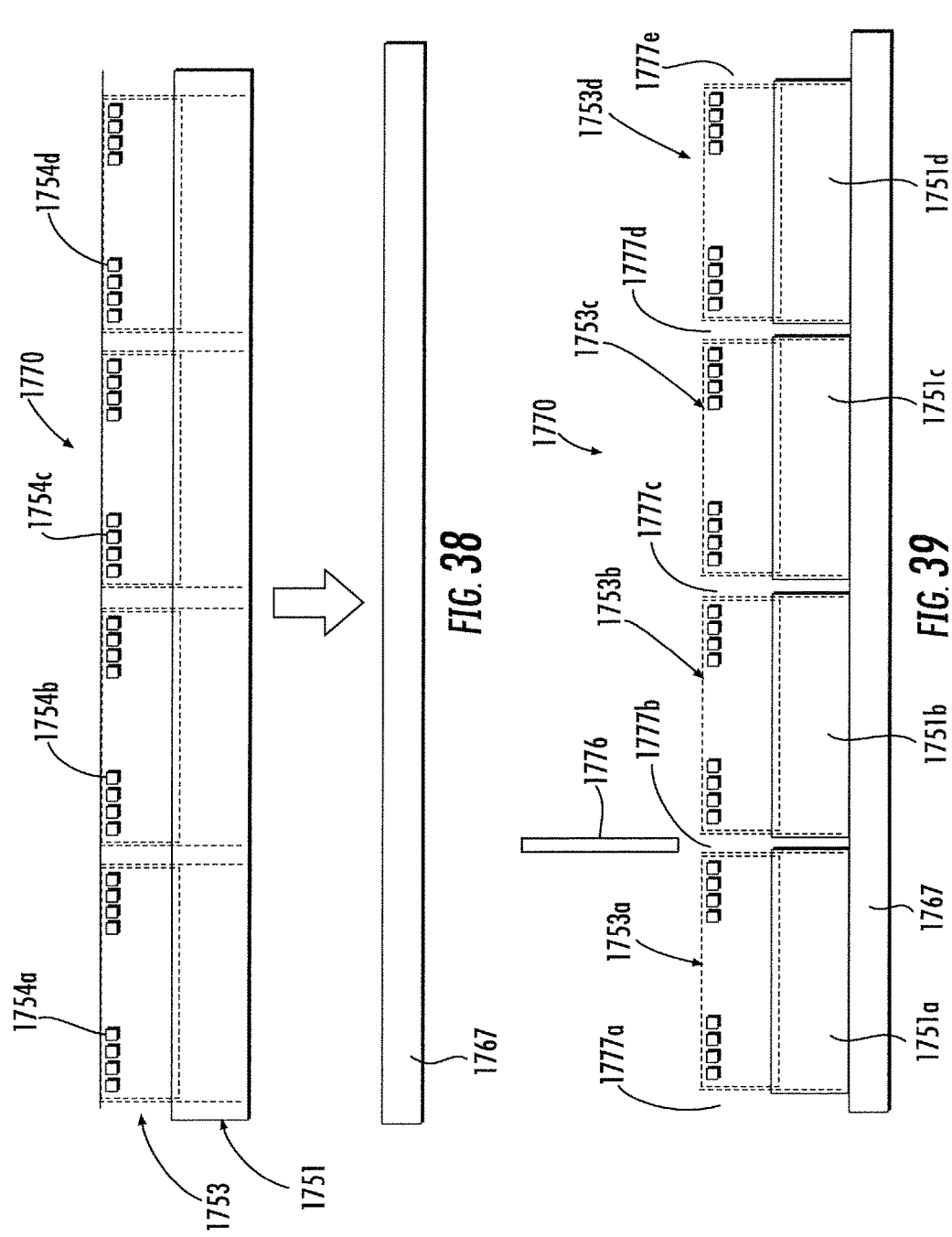

IC WITH INSULATING TRENCH AND RELATED METHODS

TECHNICAL FIELD

The present disclosure relates to the field of electronic devices, and, more particularly, to integrated circuits and related methods.

BACKGROUND

In solid structures, particularly in load-bearing structures of, for example, bridges, buildings, tunnels, railways, containment walls, dams, embankments, pipelines and underground structures of metropolitan transport lines, and so on, it is important to monitor, in many points, significant parameters, like, for example, pressure, temperature and mechanical stresses. Such monitoring is carried out periodically or continuously, and is useful both at the initial stage and during the lifetime of the structure.

For this purpose, an approach in this field includes the application of electronic monitoring devices based on electronic sensors, capable of providing good performance at low cost. Usually, such devices are applied onto the surface of the structures to be monitored, or inside recesses already in the structure and accessible from the outside.

Such devices are not able to exhaustively detect the parameters within the structure to be monitored, which it may be useful to know to evaluate the quality of the structure, its safety, its ageing, its reaction to variable atmospheric conditions, and so on. Moreover, such devices can only typically be applied after the structure has been built, and not while it is being built. Therefore, they may be unable to evaluate possible initial or internal defects.

An approach to these requirements is disclosed in U.S. Pat. No. 6,950,767 to Yamashita et al., which provides an electronic monitoring device entirely contained, i.e. "buried", within the material (for example, reinforced concrete) from which the structure to be monitored is made. More specifically, the device buried in the structure is an entire system encapsulated in a single package, made up of different parts, assembled on a substrate, such as integrated circuits, sensors, antenna, capacitors, batteries, memories, control units, and yet more, made in different chips connected together through electrical connections made with metallic connections.

The system of U.S. Pat. No. 6,950,767 to Yamashita at al. also comprises sub-systems having functions correlated with the power supply, for example, rectifiers in the case in which it receives energy from the outside, through electromagnetic waves, or else its own battery for generating the power supply internally. It may be observed that a monitoring system intended to be "embedded" initially in a building material (for example, liquid concrete, which will then solidify) and to then remain "buried" in the solid structure, is subjected to critical conditions, for example, extremely high pressures, which can even be a few hundreds of atmospheres. There are also numerous other causes of wearing, over time, due, for example, to water infiltration, capable of damaging the system.

A potential drawback to systems, such as that disclosed in U.S. Pat. No. 6,950,767 to Yamashita et al., derives from the fact that they are complex systems, even though they are enclosed in a package, and can therefore be damaged when facing the operating conditions in which they work. In particular, the electrical interconnections between the various parts of the package can be vulnerable. Generally, electrical interconnections inside a harsh environment, such as a concrete structure, are not reliable and have a short lifetime, for example, due to mechanical stress and corrosion.

Moreover, a "window" is provided in the package to allow the sensor to detect an associated parameter can be a weak point for possible infiltration of humidity. Furthermore, a crack or imperfection in the coating material can allow water and chemical substances to penetrate inside the package and cause short-circuits. In addition to water, other substances, such as potentially corrosive acids, can also infiltrate. In general, although designed for the mentioned use, the reliability of systems like that of U.S. Pat. No. 6,950,767 to Yamashita et al. has a limitation due to the complexity of the structure of such systems, although miniaturized. A possible approach is to create an electronic system fully embedded in an integrated circuit without electrical interconnections, but it may need an efficient way to supply power to IC by electromagnetic waves, reducing power loss due to semiconductor material conductivity.

SUMMARY

Generally, an integrated circuit (IC) may include a semiconductor substrate having circuitry formed therein, at least one interconnect layer above the semiconductor substrate and comprising an antenna coupled to the circuitry, and a seal ring around a periphery of the at least one interconnect layer defining the IC perimeter. The IC may include at least one electrically insulating trench extending vertically into the semiconductor substrate and extending laterally across the semiconductor substrate from adjacent one side to adjacent another side thereof, extending also outside the seal ring perimeter. Advantageously, the IC may reduce RF losses due to eddy currents during wireless powering of the IC during use and during testing in a wafer form.

More specifically, the at least one electrically insulating trench may extend laterally from one side edge to another side edge of the semiconductor substrate. For example, the circuitry may comprise a transceiver circuit and a pressure sensor circuit coupled thereto.

In some embodiments, the at least one electrically insulating trench may comprise a plurality of electrically insulating trenches. Also, the at least one electrically insulating trench may comprise a plurality of intersecting electrically insulating trenches.

Moreover, the at least one electrically insulating trench may extend vertically from a top surface of the semiconductor substrate. Alternatively, the at least one electrically insulating trench may extend vertically from a bottom surface of the semiconductor substrate.

In some embodiments, the at least one electrically insulating trench may have tapered sidewalls. In other embodiments, the seal ring may comprise a continuous electrically conductive ring. Alternatively, the seal ring may comprise a non-continuous electrically conductive ring. The IC may further comprise a passivation layer over the at least one interconnect layer.

Another aspect is directed to a method of making an IC. The method may include forming at least one interconnect layer above a semiconductor substrate and comprising an antenna coupled to circuitry in the semiconductor substrate, and forming a seal ring around a periphery of the at least one interconnect layer. The method may include forming at least one electrically insulating trench extending vertically into the semiconductor substrate and extending laterally across the semiconductor substrate from adjacent one side to adjacent another side thereof.

Another aspect is directed to a method of testing a plurality of ICs in a wafer. Each IC comprises a semiconductor substrate having circuitry formed therein, and at least one interconnect layer above the semiconductor substrate and comprising an antenna coupled to the circuitry. Each IC also includes a seal ring around a periphery of the at least one interconnect layer, and at least one electrically insulating trench extending vertically into the semiconductor substrate and extending laterally across the semiconductor substrate from adjacent one side to adjacent another side thereof. The method may include operating a testing device to direct radio frequency (RF) radiation onto the wafer to be received by the respective antennas of the plurality of ICs, the respective electrically insulating trenches of the plurality of ICs reducing eddy currents in the wafer during testing.

In some embodiments, the respective electrically insulating trenches of the plurality of ICs may be within a plurality of scribe lines in the wafer. The at least one electrically insulating trench may extend laterally from one side edge to another side edge of the semiconductor substrate. The circuitry may comprise a transceiver circuit and a pressure sensor circuit coupled thereto, and the received RF radiation may power the transceiver circuit and the pressure sensor circuit.

BRIEF DESCRIPTION OF THE DRAWINGS

FIG. 2A is a top plan view of the IC from FIG. 1.

FIG. 2B is a top plan view of a group of the ICs from FIG. 1.

FIGS. 8A-8C are top plan views of different embodiments of a group of the ICs, according to the present disclosure.

FIGS. 28-29 are schematic diagrams of a cross-section view of a method for making a wafer comprising a plurality of ICs from FIG. 27.

FIG. 32 is a schematic diagram of a cross-section view of a method for making a wafer comprising a plurality of ICs, according to another embodiment of the present disclosure.

FIG. 33 is a schematic diagram of a cross-section view of a method for making a wafer comprising a plurality of ICs, according to yet another embodiment of the present disclosure.

FIGS. 35-37 are flowcharts for methods for making embodiments of the IC, according to the present disclosure.

FIGS. 38-39 are schematic diagrams of a cross-section view of a method for making a wafer comprising a plurality of ICs from FIG. 34.

DETAILED DESCRIPTION

Figure 1:
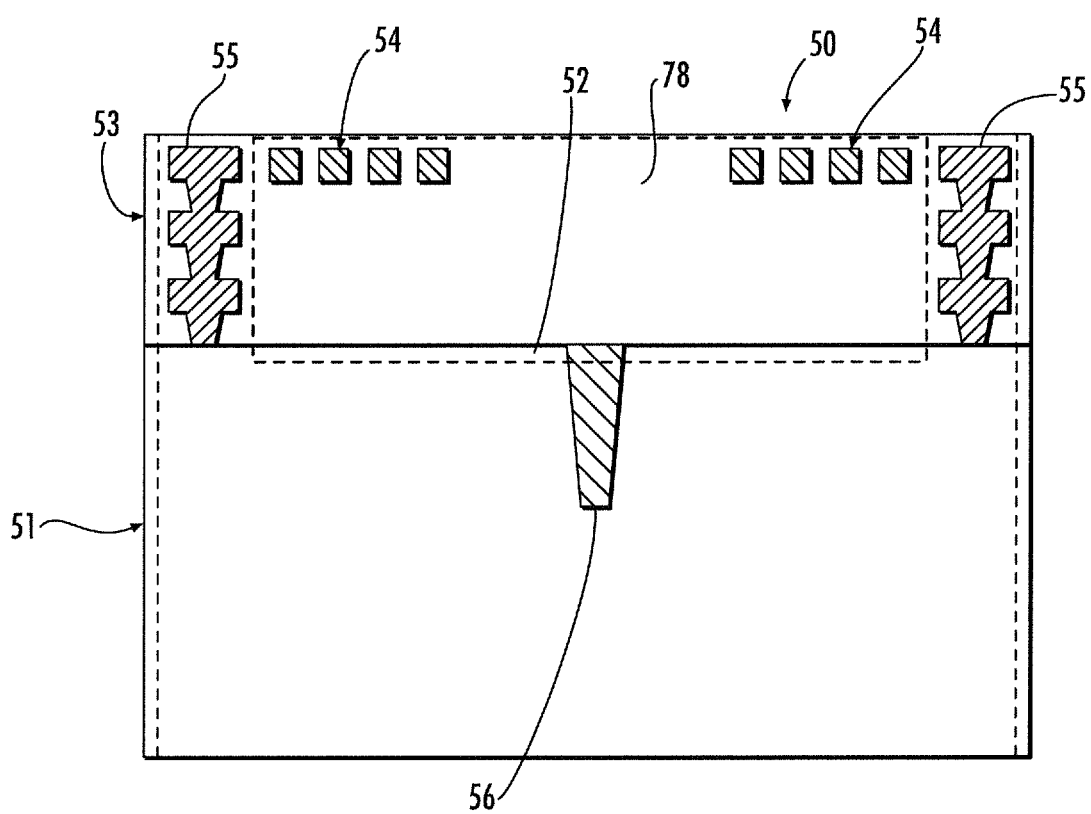
FIG. 1 is a schematic diagram of a cross-section view along line 1-1 of an IC, according to the present disclosure.

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout. Also, prime notation and base 100 reference numerals are used to indicate similar elements in alternative embodiments.

Referring initially to FIGS. 1-2B, an IC 50 according to the present disclosure is now described. The IC 50 illustratively includes a semiconductor substrate 51 having circuitry 52 formed therein, and an interconnect layer 53 above the semiconductor substrate. The semiconductor substrate 51 may comprise silicon or Gallium Arsenide, for example. The interconnect layer 53 illustratively includes at least one dielectric layer 78, and an antenna 54 carried by the dielectric layer and coupled to the circuitry. The antenna 54 comprises an electrically conductive material, such as copper or aluminum.

The IC 50 illustratively includes a seal ring 55 around a periphery of the interconnect layer 53, defining the IC perimeter. The seal ring 55 also comprises an electrically conductive material, such as aluminum. As perhaps best seen in FIGS. 2A and 2B, the seal ring 55 is a continuous electrically conductive ring. The seal ring 55 is illustratively squared shaped, but may also take other shapes.

The IC 50 includes a plurality of electrically insulating trenches 56, 57 extending vertically into the semiconductor substrate 51 and extending laterally across the semiconductor substrate from adjacent one side to adjacent another side thereof, extending also outside the seal ring perimeter. In other embodiments, the IC 50 may include a single electrically insulating trench. In this illustrated embodiment, the electrically insulating trenches 56, 57 extend vertically and laterally respectively from one side edge to another side edge of the semiconductor substrate 51, but it should be appreciated that in some embodiments, the electrically insulating trenches need not extend completely to the edges of the semiconductor substrate.

Also, the electrically insulating trenches 56, 57 are substantially perpendicular and intersect each other. In other embodiments, the plurality of electrically insulating trenches 56, 57 may be canted at other angles.

In this illustrated embodiment, the plurality of electrically insulating trenches 56, 57 extend vertically from a top surface of the semiconductor substrate 51. Also, each electrically insulating trench 56, 57 has tapered sidewalls. Nevertheless, the electrically insulating trenches 56, 57 may have straight sidewalls in other embodiments.

Another aspect is directed to a method of making an IC 50. The method may include forming at least one interconnect layer 53 above a semiconductor substrate 51 and comprising an antenna 54 coupled to circuitry 52 in the semiconductor substrate, and forming a seal ring 55 around a periphery of the at least one interconnect layer. The method may include forming at least one electrically insulating trench 56, 57 extending vertically into the semiconductor substrate 51 and extending laterally across the semiconductor substrate from adjacent one side to adjacent another side thereof.

During typical applications, the IC 50 is irradiated with RF energy to wirelessly power the circuitry 52. For example, in one exemplary application, the circuitry 52 comprises a transceiver circuit and a pressure sensor circuit coupled thereto, and the IC 50 is embedded in a harsh environment like a concrete structure to monitor a structural characteristic, as noted in the background section hereinabove. Since the IC 50 is physically isolated, it is powered and communicated with wirelessly. One drawback to this approach is the increase in RF losses from eddy currents in the semiconductor substrate 51 during single IC use and wafer 70 testing.

As will be discussed herein, the electrically insulating trenches 56, 57 form an insulating grid in the wafer 70, which may reduce eddy currents during testing. Also, the electrically insulating trenches 56, 57 provide an insulating grid that reduces RF loss when the single IC 50 is activated in applications in the field. As perhaps best seen in FIG. 2B, the electrically insulating trenches 56, 57 cross scribe lines 109a-109b that separate the several ICs 50a-50d in the wafer 70, i.e. they do not necessarily need to have a closed form to reduce eddy currents.

Figure 3:
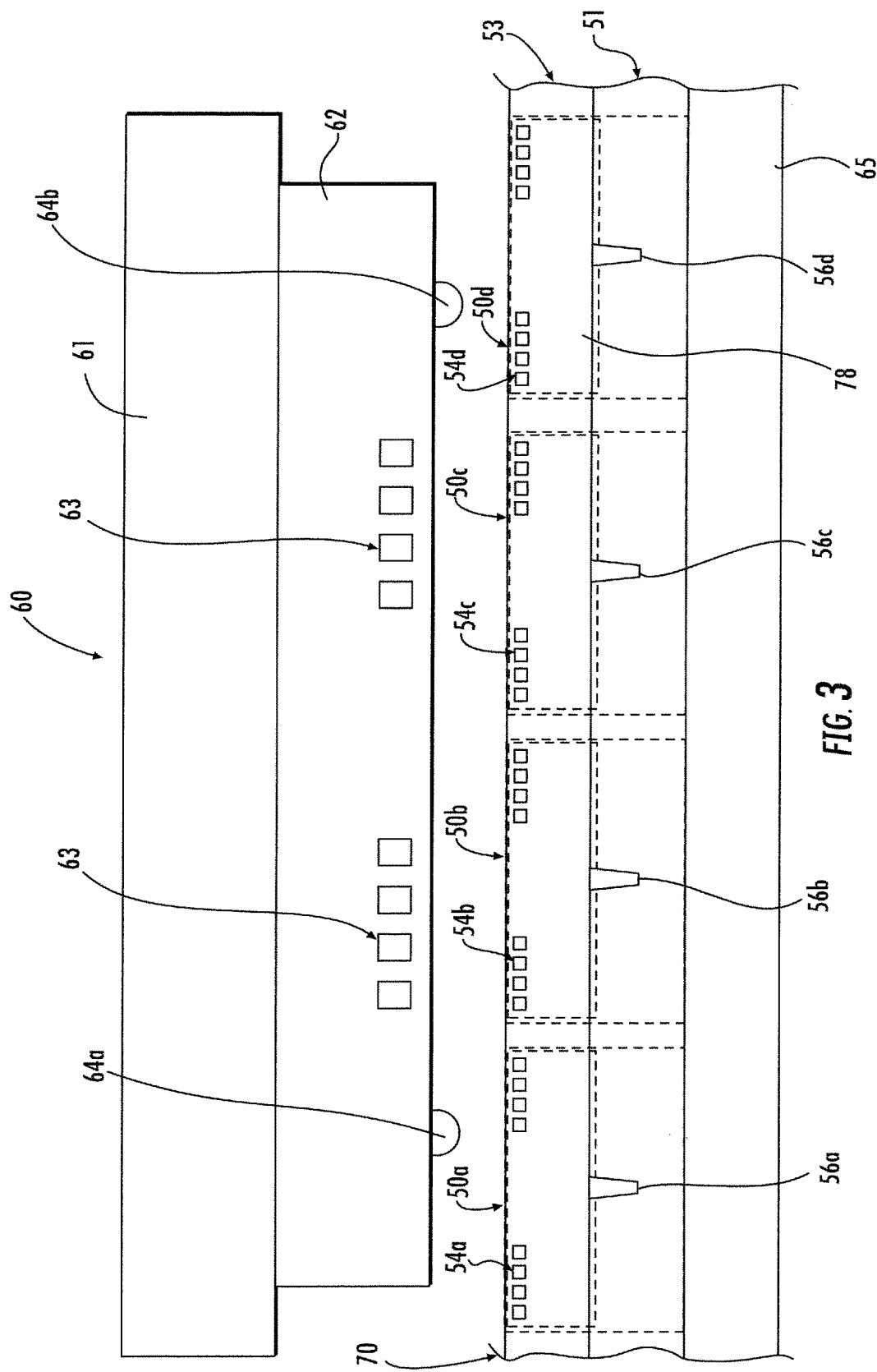
FIG. 3 is a schematic diagram of a cross-section view of a wafer under test, the wafer comprising a plurality of ICs of FIG. 1.

Referring now additionally to FIG. 3, as will be described herein in detail, the IC 50 may be manufactured with wafer level processing. Before singulation, a wafer 70 may comprise a plurality of ICs 50a-50d. The singulation step may create individual ICs 50a-50d (FIG. 2A), or in some embodiments, a group of ICs (FIG. 2B). The seal rings 55a-55d are not shown to simplify the drawing.

Before singulation, the method for making the IC 50 illustratively includes a testing step using Automatic Testing Equipment (ATE), i.e. a testing device 60. The ATE 60 illustratively includes a base 61, an antenna circuit board 62 carried by the base, an antenna 63 carried by the antenna circuit board, and a plurality of electrically conductive contacts 64a-64b also carried by the antenna circuit board. The ATE 60 illustratively includes a prober chuck 65 carrying the wafer 70 under test. Contacts 64a-64b allow for alignment of the antenna 63 with at least one IC of wafer 70.

In particular, another aspect is directed to a method of testing a plurality of ICs 50a-50d in a wafer 70. Each IC 50a-50d comprises a semiconductor substrate 51 having circuitry 52 formed therein, and at least one interconnect layer 53 above the semiconductor substrate and comprising an antenna 54a-54d coupled to the circuitry. Each IC 50a-50d also includes a seal ring 55 (omitted from FIG. 3 for clarity) around a periphery of the at least one interconnect layer 53, and at least one electrically insulating trench 56a-56d extending vertically into the semiconductor substrate 51 and extending laterally across the semiconductor substrate from adjacent one side to adjacent another side thereof. The method may include operating a testing device 60 to direct RF radiation onto the wafer 70 to be received by the respective antennas 54a-54d of the plurality of ICs 50a-50d, the respective electrically insulating trenches 56a-56d of the plurality of ICs reducing eddy currents in the wafer during testing.

In typical approaches, when the wafer is radiated with RF energy, eddy currents increase RF losses in the ICs. In other words, the ratio of the power transferred to the ICs over the power transmitted by the ATE is reduced. In the wafer 70 disclosed herein, the RF losses are reduced since the wafer is subdivided by the electrically insulating trenches 56a-56d and the additional electrically insulating trenches 57a-57b.

Figure 4:
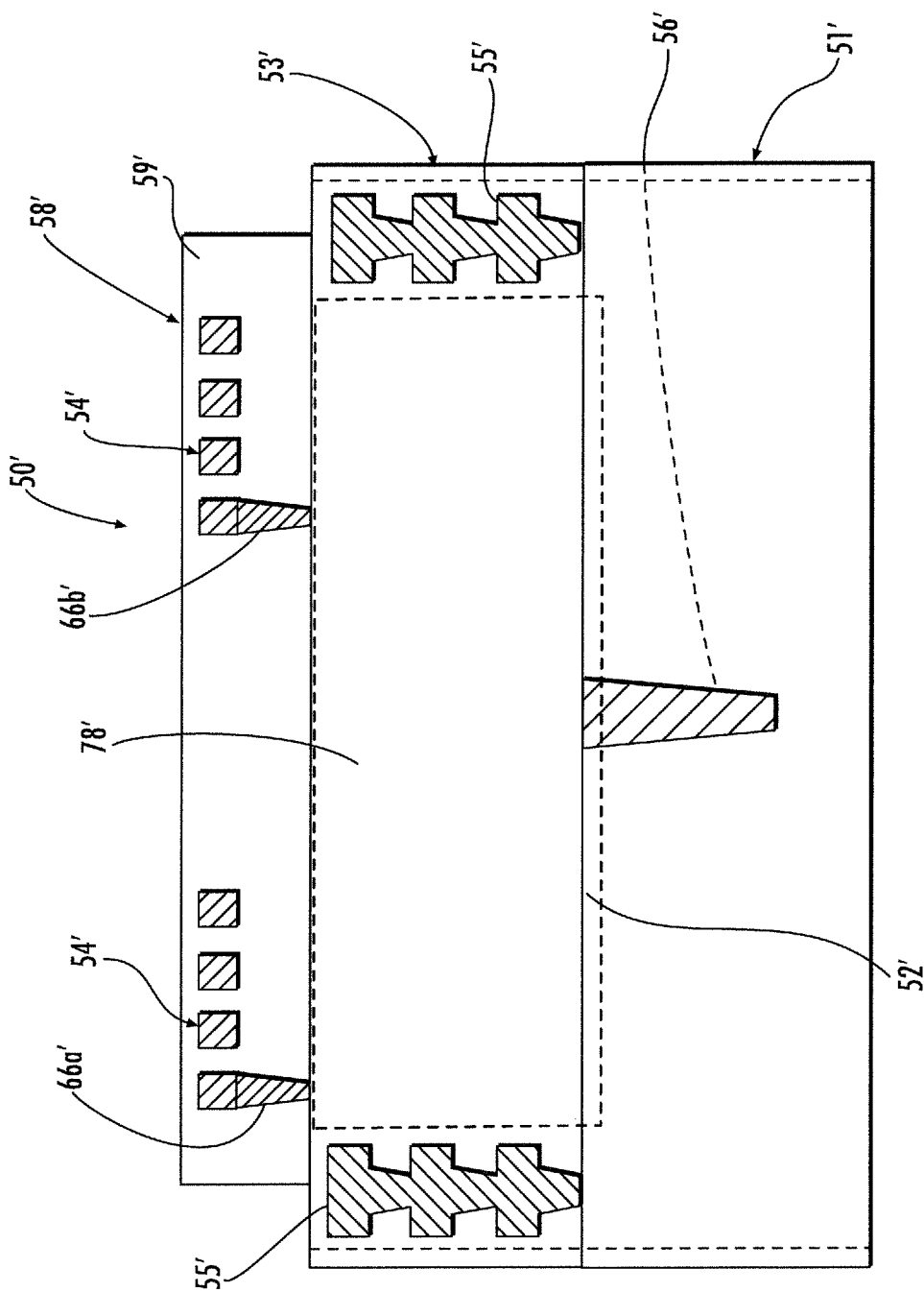
FIG. 4 is a schematic diagram of a cross-section view of another embodiment of an IC, according to the present disclosure.

Referring now additionally to FIG. 4, another embodiment of the IC 50' is now described. In this embodiment of the IC 50', those elements already discussed above with respect to FIGS. 1-3 are given prime notation and most require no further discussion herein. This embodiment differs from the previous embodiment in that this IC 50' illustratively includes an additional circuit layer 58' on top of the interconnect layer 53'. The additional circuit layer 58' illustratively includes a dielectric layer 59', an antenna 54' carried thereby (rather than the interconnect layer 53'), and a plurality of electrically conductive vias 66a'-66b' coupled between the antenna and the circuitry 52' of the semiconductor substrate 51'. For example, electrically conductive vias 66a'-66b' may be electrically coupled with two conductive pads, here not shown.

In this embodiment, the additional circuit layer 58' can be created in post processing. The additional circuit layer 58' may be positioned directly on a passivation layer (not shown). Also, the dimensions of the additional circuit layer 58' may be tailored to maintain a safe standoff from the scribe lines, thereby preventing damage during mechanical singulation.

Figure 5:
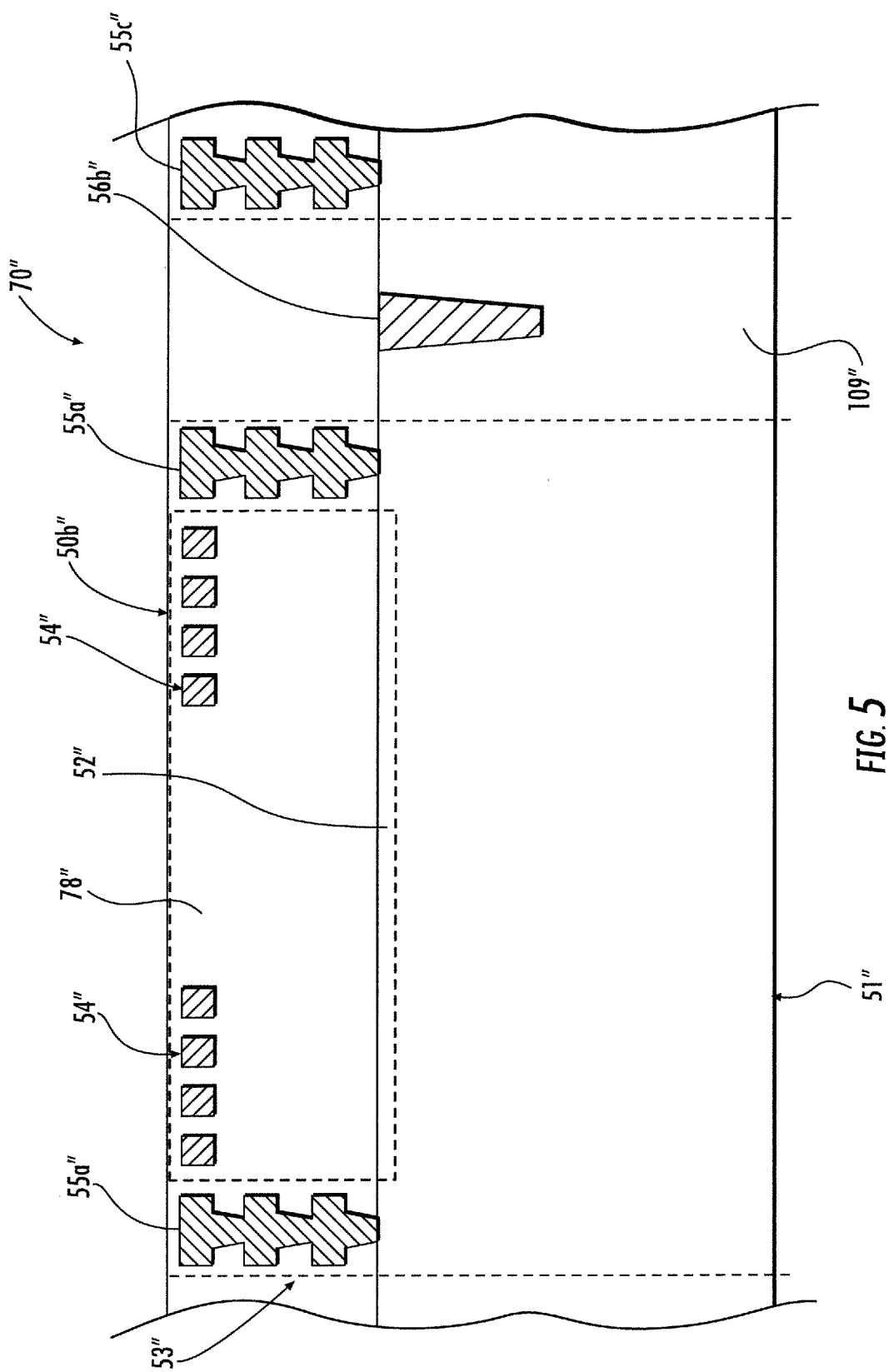
FIG. 5 is a schematic diagram of a cross-section view along line 5-5 of another embodiment of an IC, according to the present disclosure.
Figure 6:
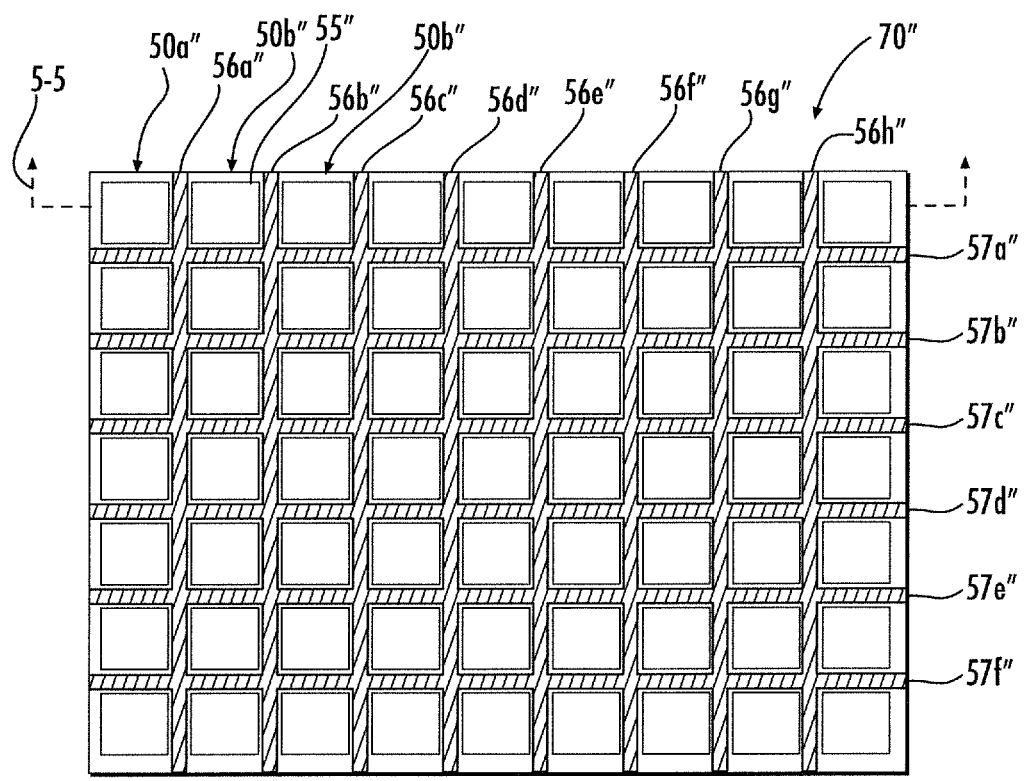
FIG. 6 is a top plan view of a wafer of the ICs from FIG. 5.

Referring now additionally to FIGS. 5-6, another embodiment of the IC 50" is now described. In this embodiment of the IC 50", those elements already discussed above with respect to FIGS. 1-3 are given double prime notation and most require no further discussion herein. This embodiment differs from the previous embodiment in that this IC 50" illustratively includes the electrically insulating trench 56b" within the scribe lines 109" of the wafer 70" (rather than the semiconductor substrate layer 51"). In other words, the final singulated device would not include the electrically insulating trench 56b". The electrically insulating trench 56b" may be formed with a through silicon via technique. As perhaps best seen in FIG. 6, the electrically insulating trenches 56a"-57f" are oriented orthogonally and to intersect throughout the wafer 70".

Figure 7:
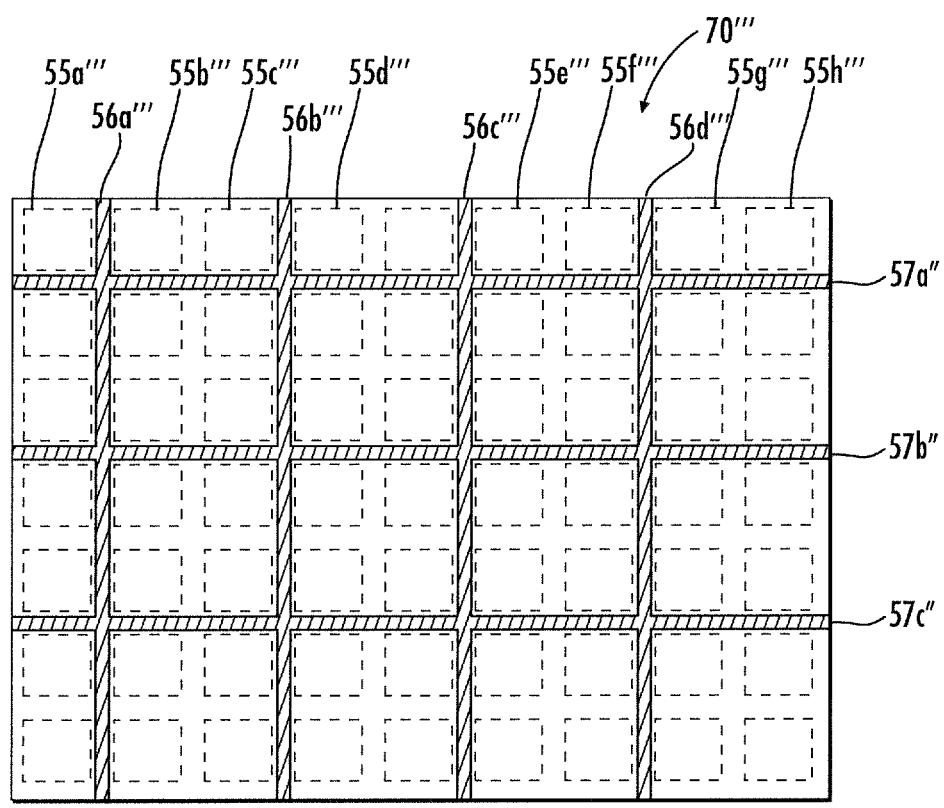
FIG. 7 is a top plan view of a wafer of another embodiment of ICs, according to the present disclosure.

Referring now additionally to FIG. 7, another embodiment of the IC 50''' is now described. In this embodiment of the IC 50''', those elements already discussed above with respect to FIGS. 5-6 are given triple prime notation and most require no further discussion herein. This embodiment differs from the previous embodiment in that this IC 50''' illustratively includes a seal ring 55a'''-55g''' that is non-continuous. Moreover, the seal rings 55a'''-55g''' are electrically an open circuit, to avoid generation of eddy currents during testing. For example, the seal rings 55a'''-55h''' may be coupled to a reference potential, but are not electrically coupled to the semiconductor substrate 51'''. In this embodiment, electrically insulating trenches 56a"-57f" create an insulating grid, where each insulating ring of insulating grid can surround at least one IC.

Referring now additionally to FIG. 8A, another embodiment of the wafer 170 is now described. In this embodiment of the wafer 170, those elements already discussed above with respect to FIGS. 5-6 are incremented by 100 and most require no further discussion herein. This embodiment differs from the previous embodiment in that this wafer 170 illustratively includes L-shaped electrically insulating trenches 156a-156d that do not intersect.

Referring now additionally to FIG. 8B, another embodiment of the wafer 270 is now described. In this embodiment of the wafer 270, those elements already discussed above with respect to FIGS. 5-6 are incremented by 200 and most require no further discussion herein. This embodiment differs from the previous embodiment in that this wafer 270 illustratively includes T-shaped electrically insulating trenches 256a-256d that do not intersect.

Referring now additionally to FIG. 8C, another embodiment of the wafer 370 is now described. In this embodiment of the wafer 370, those elements already discussed above with respect to FIGS. 5-6 are incremented by 300 and most require no further discussion herein. This embodiment differs from the previous embodiment in that this wafer 370 illustratively includes cross-shaped electrically insulating trenches 356a-356d that do not intersect.

In the embodiments of FIGS. 8A-8C, to improve the mechanical strength of the wafer 170, 270, 370, the grid of electrically insulating trenches 156a-156d, 256a-256d, 356a-356d may have some gaps that may be positioned to avoid increasing eddy currents. Also, the electrically insulating trenches 156a-156d, 256a-256d, 356a-356d may be positioned to obstruct the path for passing eddy currents, for example, by increasing the electric current path length or reducing the electric current path cross-section, thus reducing the intensity of the eddy currents. In another embodiment, not shown here, the electrically insulating trenches 156a-156d, 256a-256d, 356a-356d can be shifted and/or rotated in a way that at least a portion of one of them may be at least partially comprised inside an IC. Many other possible shapes and geometries, different from what is shown in FIGS. 8A-8C, are possible.

Figure 9:
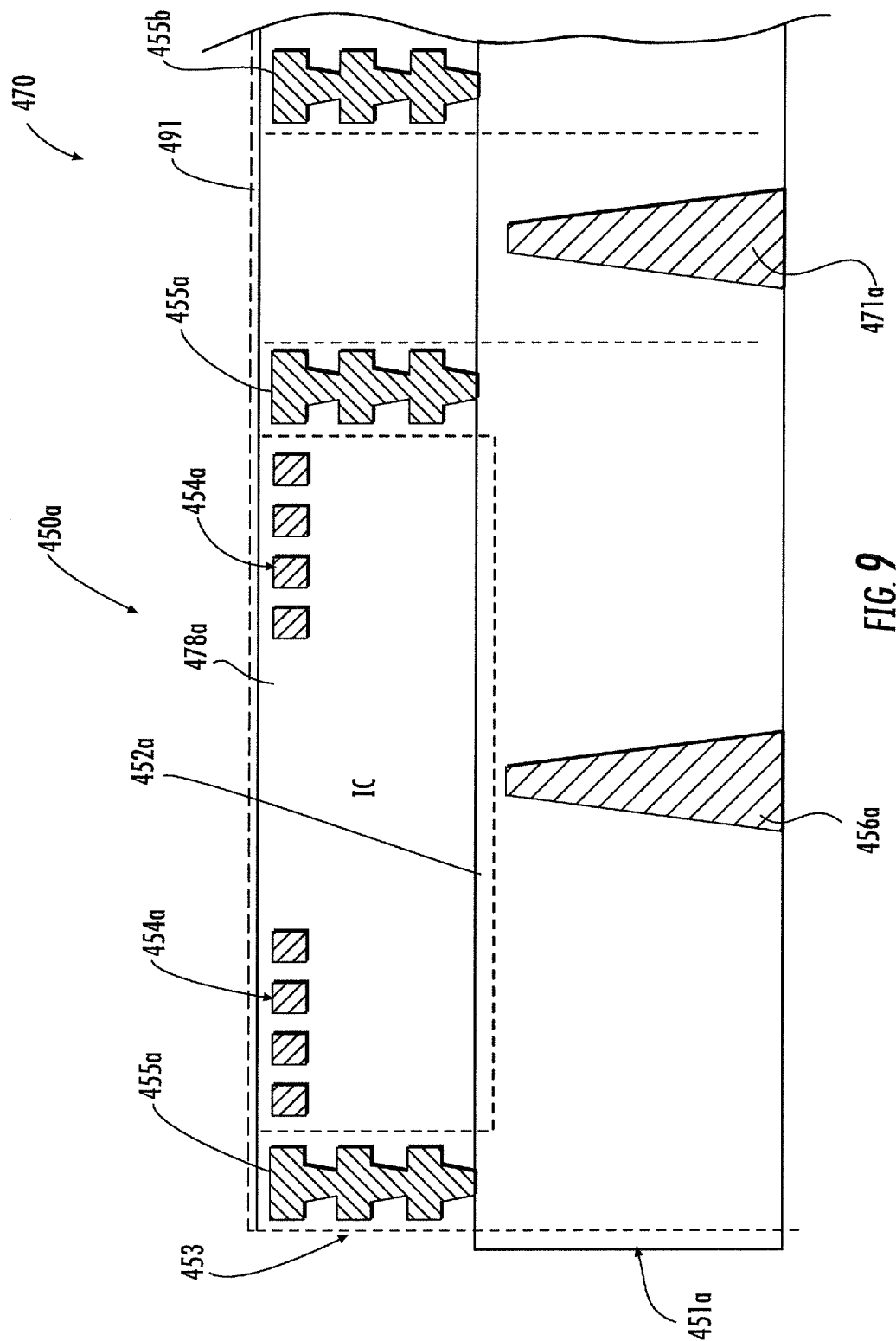
FIG. 9 is a schematic diagram of a cross-section view of yet another embodiment of an IC, according to the present disclosure.

Referring now additionally to FIG. 9, another embodiment of the wafer 470 is now described. In this embodiment of the wafer 470, those elements already discussed above with respect to FIGS. 1-3 are incremented by 400 and most require no further discussion herein. This embodiment differs from the previous embodiment in that this wafer 470 illustratively includes a plurality of ICs 450a further comprising a passivation layer 491 over the interconnect layer 453. The passivation layer 491 protects the circuitry 452 and prevents infiltration of contaminants. In this embodiment, the electrically insulating trench 456a extends vertically from a bottom surface of the semiconductor substrate 451a. This wafer 470 illustratively includes an additional electrically insulating trench 471a within the scribe lines of the wafer 470, also extending from the bottom surface of the semiconductor substrate 451a. The electrically insulating trenches 456a, 471a may comprise fill material of a dielectric material, an oxide material, or a polymer material, for example.

Figure 10:
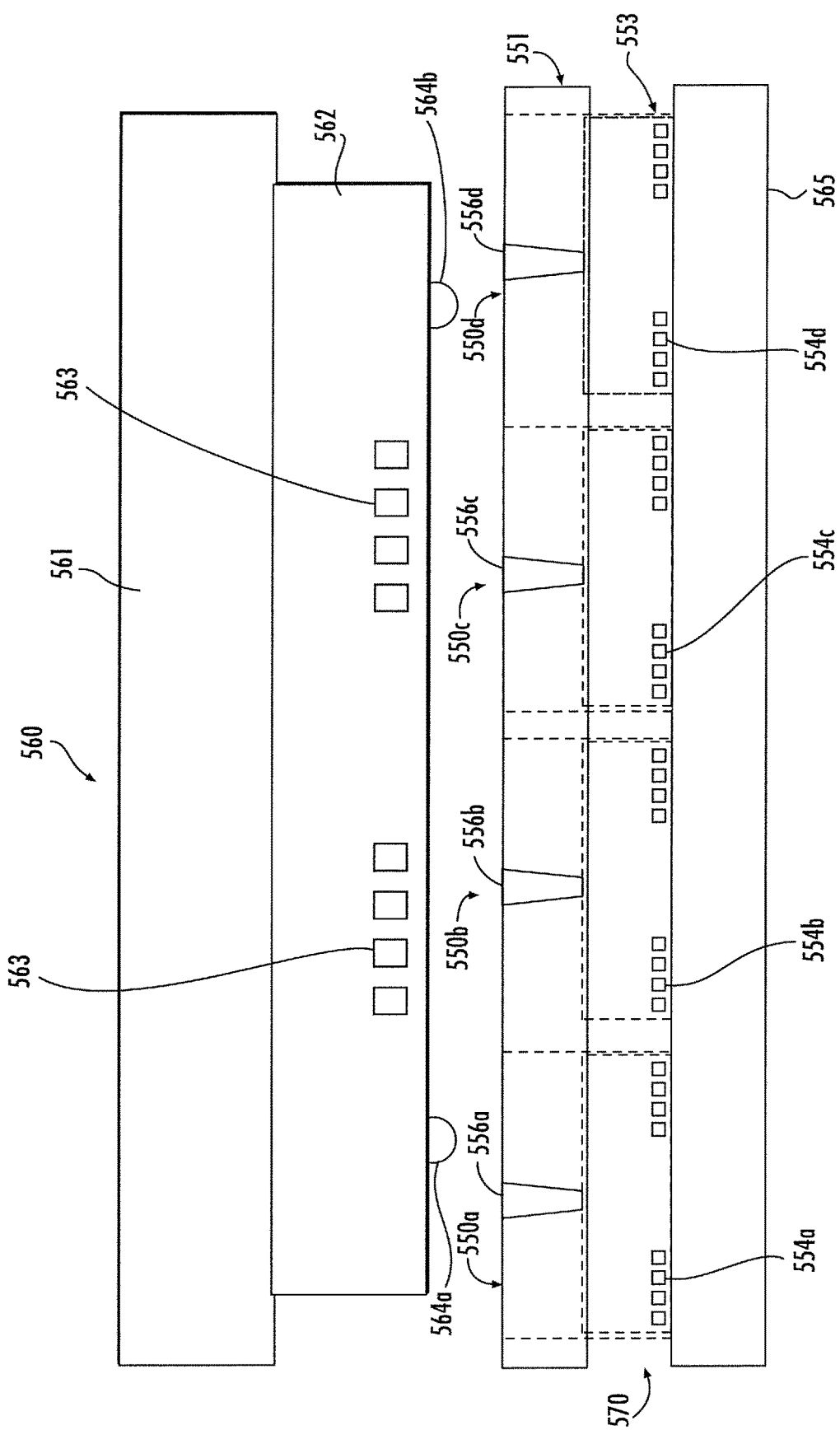
FIG. 10 is a schematic diagram of a cross-section view of a wafer under test, the wafer comprising a plurality of ICs, according to another embodiment of the present disclosure.

Referring now additionally to FIG. 10, another embodiment of the wafer 570 under test is now described. In this embodiment of the wafer 570, those elements already discussed above with respect to FIGS. 1-3 are incremented by 500 and most require no further discussion herein. This embodiment differs from the previous embodiment in that this wafer 570 illustratively includes a plurality of ICs 550a-550d with the electrically insulating trenches 556a-556d extending vertically from the bottom surface of the semiconductor substrate 551. In this embodiment, the prober chuck 565 may comprise an insulating material, for example, ceramic.

Figure 11:
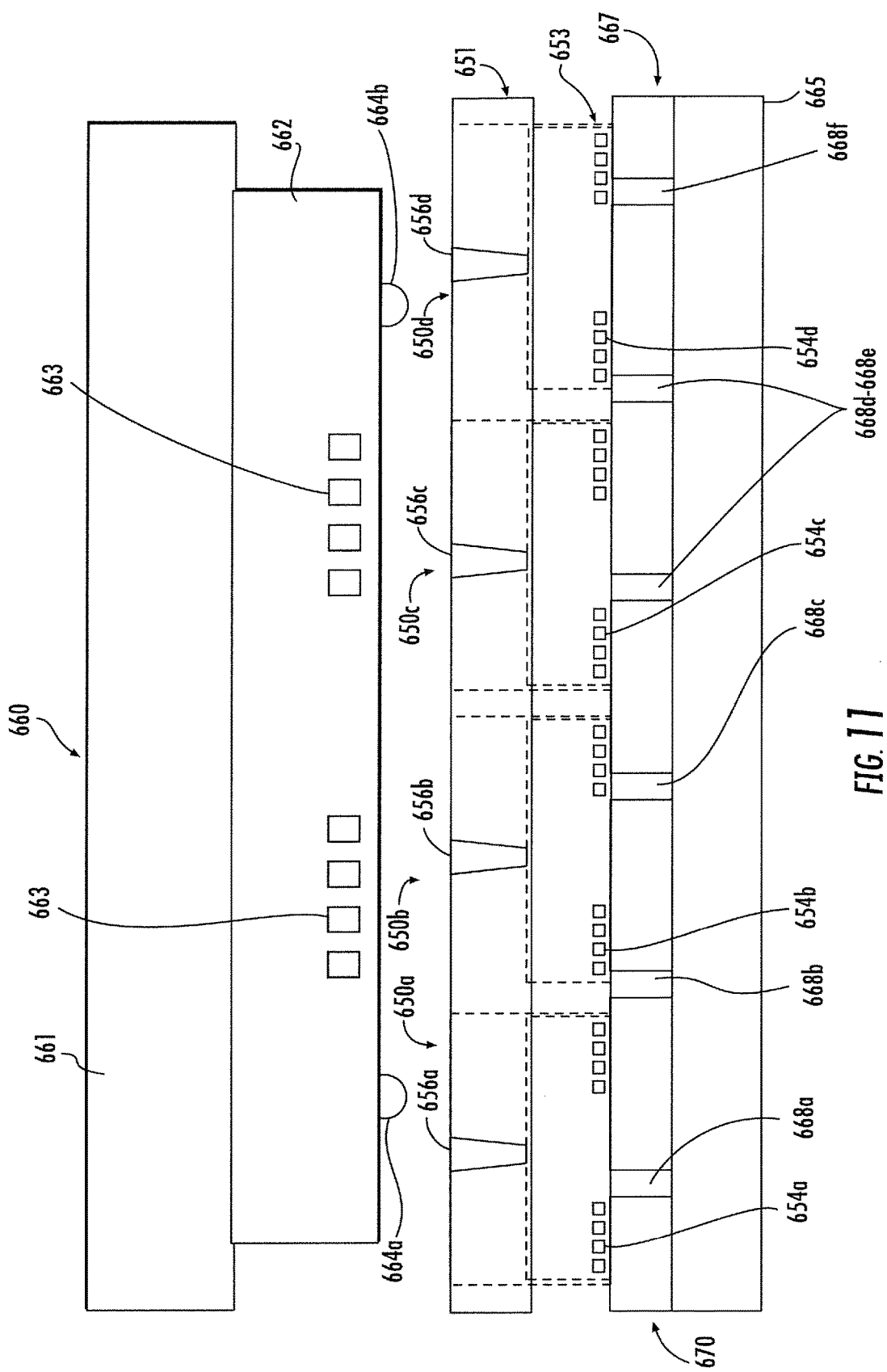
FIG. 11 is a schematic diagram of a cross-section view of a wafer under test, the wafer comprising a plurality of ICs, according to yet another embodiment of the present disclosure.

Referring now additionally to FIG. 11, another embodiment of the wafer 670 under test is now described. In this embodiment of the wafer 670, those elements already discussed above with respect to FIGS. 1-3 are incremented by 600 and most require no further discussion herein. This embodiment differs from the previous embodiment in that the ATE 660 illustratively includes a support layer 667 on the prober chuck 665. The support layer 667 defines a plurality of openings 668a-668f therethrough for permitting communication of a vacuum source to the wafer 670 from within the ATE 660. In some embodiments (not shown), the support layer 667 may be solid. The support layer 667 may comprise an electrically insulating material to increase the distance among a metallic prober chuck 665 and antennas 654a-654d, allowing wireless power transfer among antenna 63 and the plurality of ICs 550a-550d.

Figure 12:
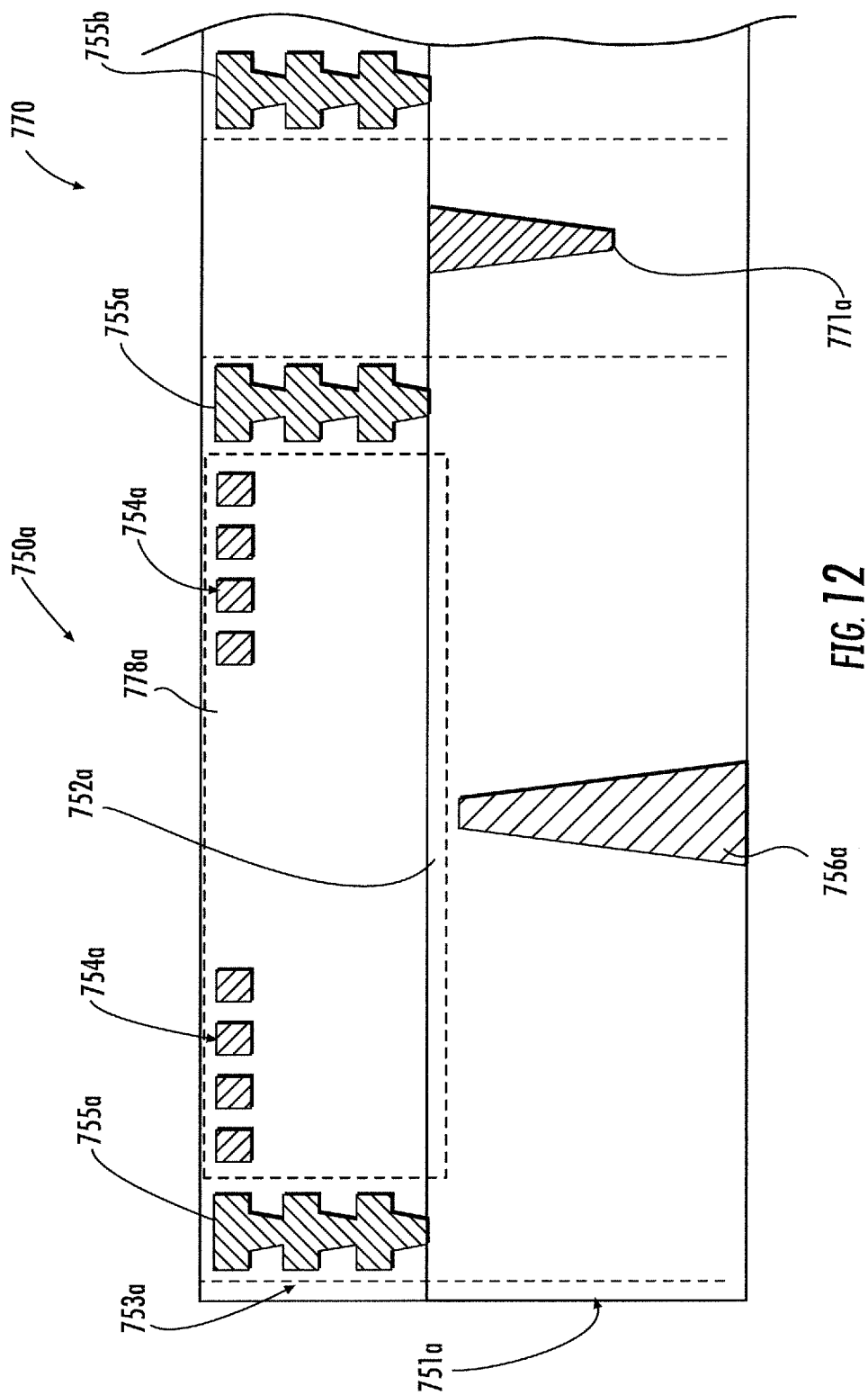
FIG. 12 is a schematic diagram of a cross-section view along line 12-12 of yet another embodiment of an IC, according to the present disclosure.
Figure 13:
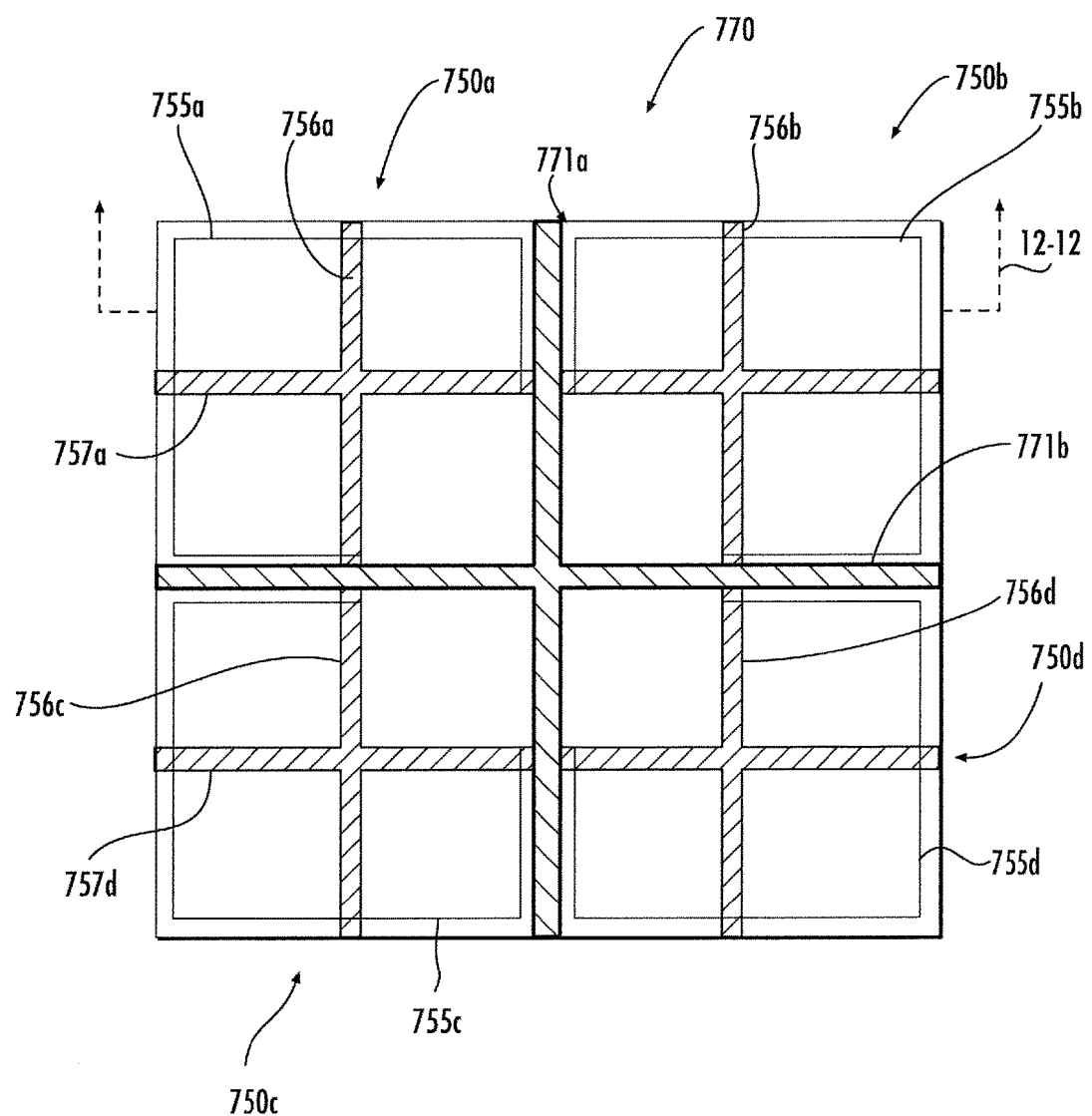
FIG. 13 is a top plan view of a group of the ICs from FIG. 12.

Referring now additionally to FIGS. 12-13, another embodiment of the wafer 770 is now described. In this embodiment of the wafer 770, those elements already discussed above with respect to FIGS. 1-3 are incremented by 700 and most require no further discussion herein. This embodiment differs from the previous embodiment in that this wafer 770 has the electrically insulating trenches 756a-756b extending vertically from a bottom surface of the semiconductor substrate 751a. This wafer 770 illustratively includes additional electrically insulating trenches 771a-771b within the scribe lines of the wafer 770, but differently extending from a top surface of the semiconductor substrate 751a. This staggered arrangement of the electrically insulating trenches 756a-756b and the additional electrically insulating trenches 771a-771b may increase the mechanical strength of the wafer 770 during handling. In this embodiment, the electrically insulating trenches 756a-756b and the additional electrically insulating trenches 771a-771b extend orthogonally and intersect with each other. Considering a variable magnetic field orthogonal to wafer surface, eddy currents inside semiconductor are parallel to wafer surface, then the introduction of electrically insulating trenches 756a-756b and 771a-771b may drastically reduce power loss partitioning the semiconductor material reducing the parasitic electric current path.

Figure 14:
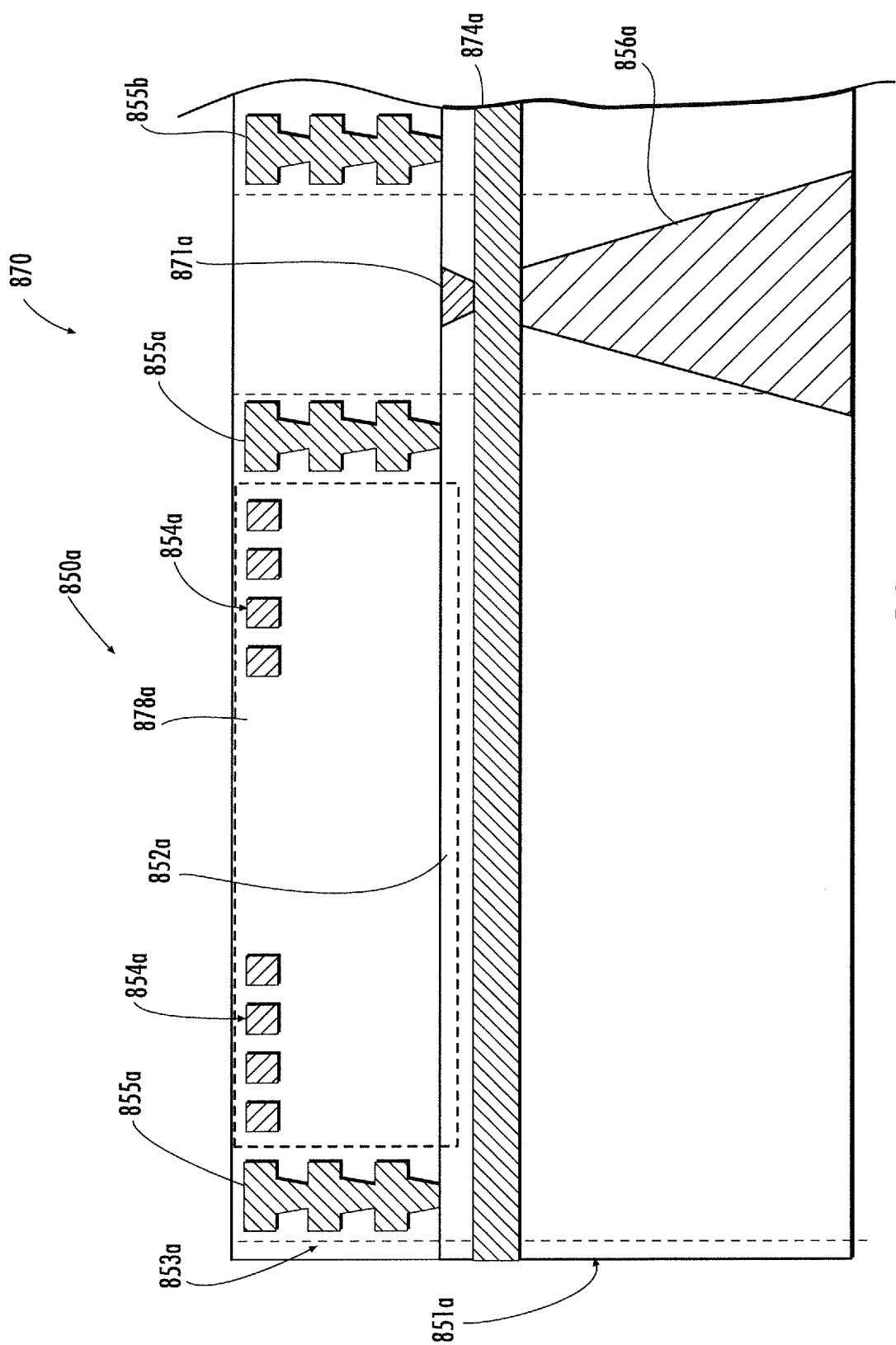
FIG. 14 is a schematic diagram of a cross-section view of another embodiment of an IC, according to the present disclosure.
Figure 15:
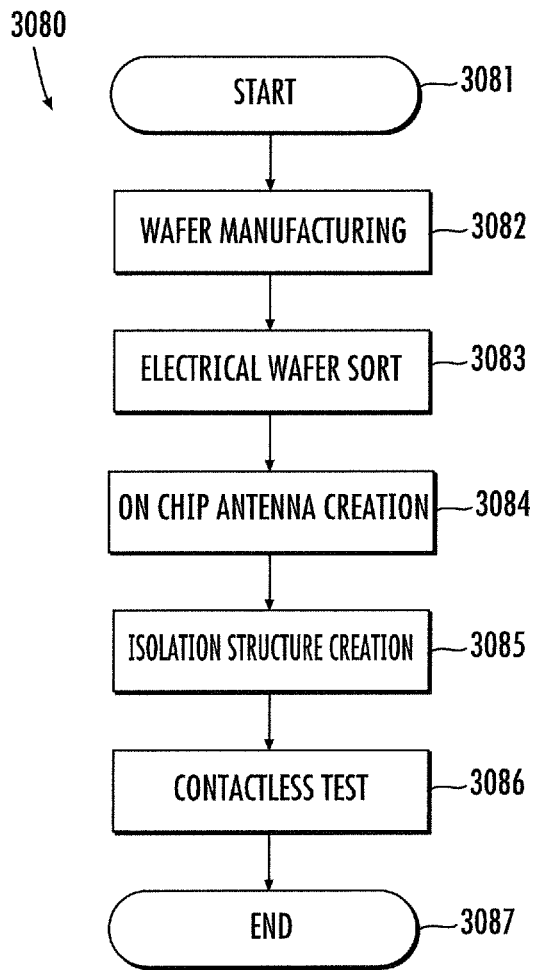
FIGS. 15-18 are flowcharts for methods for making several embodiments of the IC, according to the present disclosure.
Figure 16:
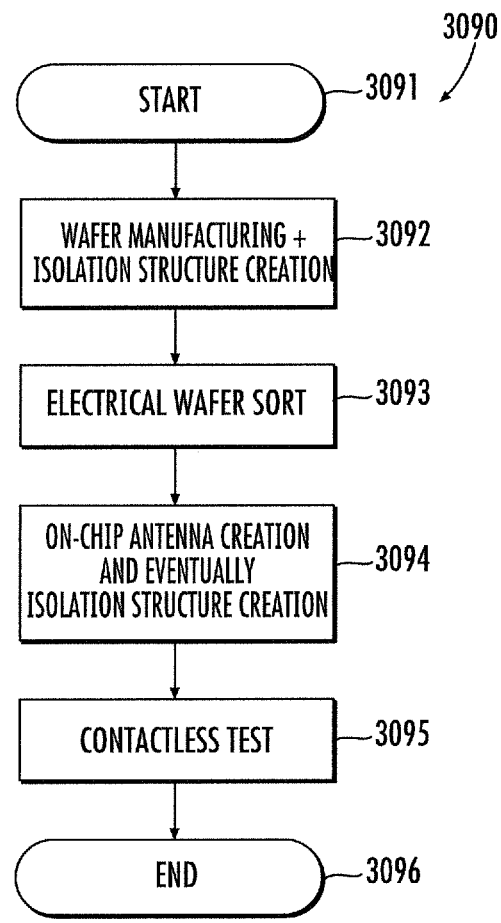
Figure 17:
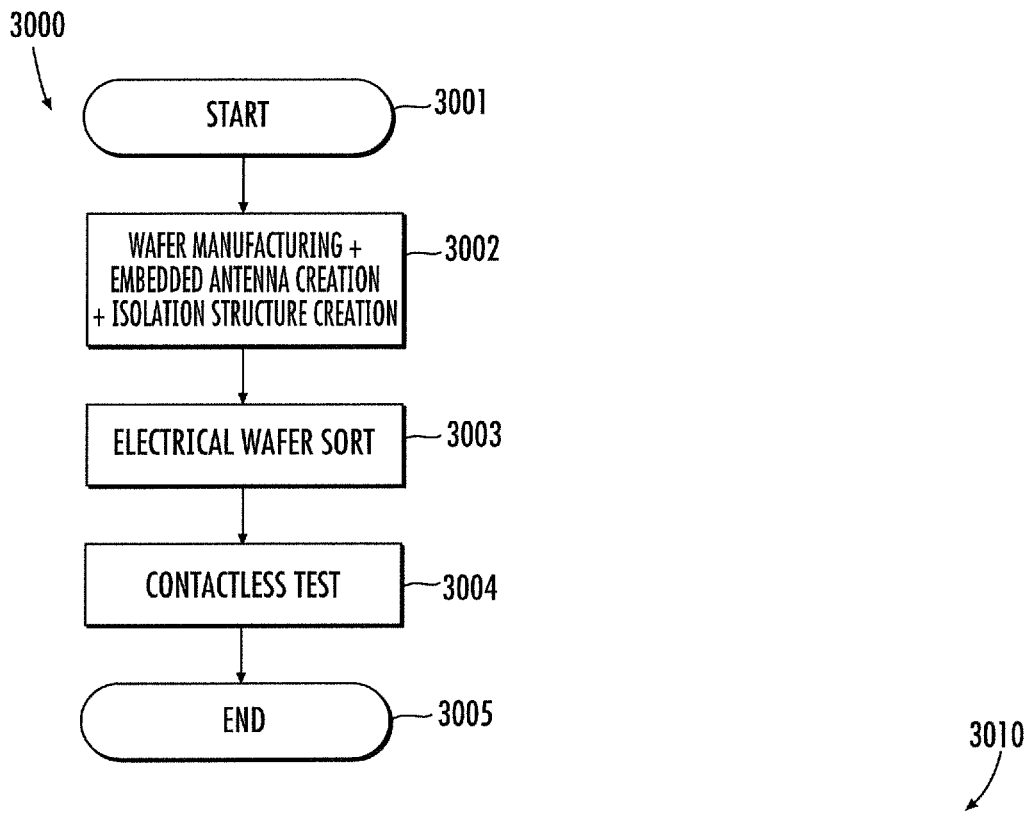
Figure 18:
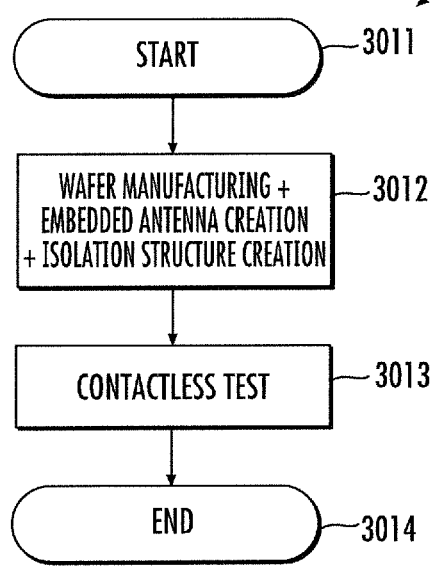

Referring now additionally to FIG. 14, another embodiment of the wafer 870 is now described. In this embodiment of the wafer 870, those elements already discussed above with respect to FIGS. 1-3 are incremented by 800 and most require no further discussion herein. This embodiment differs from the previous embodiment in that this wafer 870 illustratively includes the plurality of ICs 850a-850d with the electrically insulating trenches 856a extending vertically from the bottom surface of the semiconductor substrate 851a. In this embodiment, the additional electrically insulating trenches 871a extend from the top surface of the semiconductor substrate, and the IC 850a-850d illustratively includes an electrically insulating layer 874a between the electrically insulating trenches. The semiconductor substrate 851a comprises a silicon-on-insulator substrate. In this wafer 870, the electrically insulating trenches 856a, 871a are within the scribe lines of the wafer, but they can be created in different positions.

Referring to FIGS. 15-18, flowcharts 3080, 3090, 3000, & 3010 illustrate several embodiments of manufacturing process flows for the above embodiments. Flowchart 3080 shows a method comprising a wafer manufacturing step, an electrical wafer sort step, an on-chip antenna forming step, an isolation structure forming step, and a contactless test step. (Blocks 3081-3087). Flowchart 3090 shows a method comprising a wafer manufacturing/isolation structure forming step, an electrical wafer sort step, an on-chip antenna forming step, and a contactless test step. (Blocks 3091-3096). Electrical wafer sort step may be performed using standard test equipment like an ATE that will test an IC by means of a standard probe card that will be electrically coupled to the pads of IC (not shown), these pads may not be available after on-chip antenna forming step. An example of an on-chip antenna is the antenna 54' shown in FIG. 4. Flowchart 3000 shows a method comprising a wafer manufacturing/embedded antenna forming/isolation structure forming step, an electrical wafer sort step, and a contactless test step. (Blocks 3001-3005). Flowchart 3010 shows a method comprising a wafer manufacturing/embedded antenna forming/isolation structure forming step, and a contactless test step. (Blocks 3011-3014). Eventually, after the contactless test step, the IC 50 may be assembled in a suitable package, and this and other following steps are not shown to simplify the drawings. Flowchart 3080 may be used, for example, to create IC 50' as shown in FIG. 4, replacing insulating trench 56' with insulating trench 456a shown in FIG. 9, or to create IC 450a in FIG. 9, replacing antenna 454a with antenna 54' shown in FIG. 4. Flowchart 3090 may be used to create an embodiment similar to IC 50'. Flowcharts 3000 and 3010 may be used for example to create ICs 50, 50b'', 450a, 750a and 850a.

Figure 19:
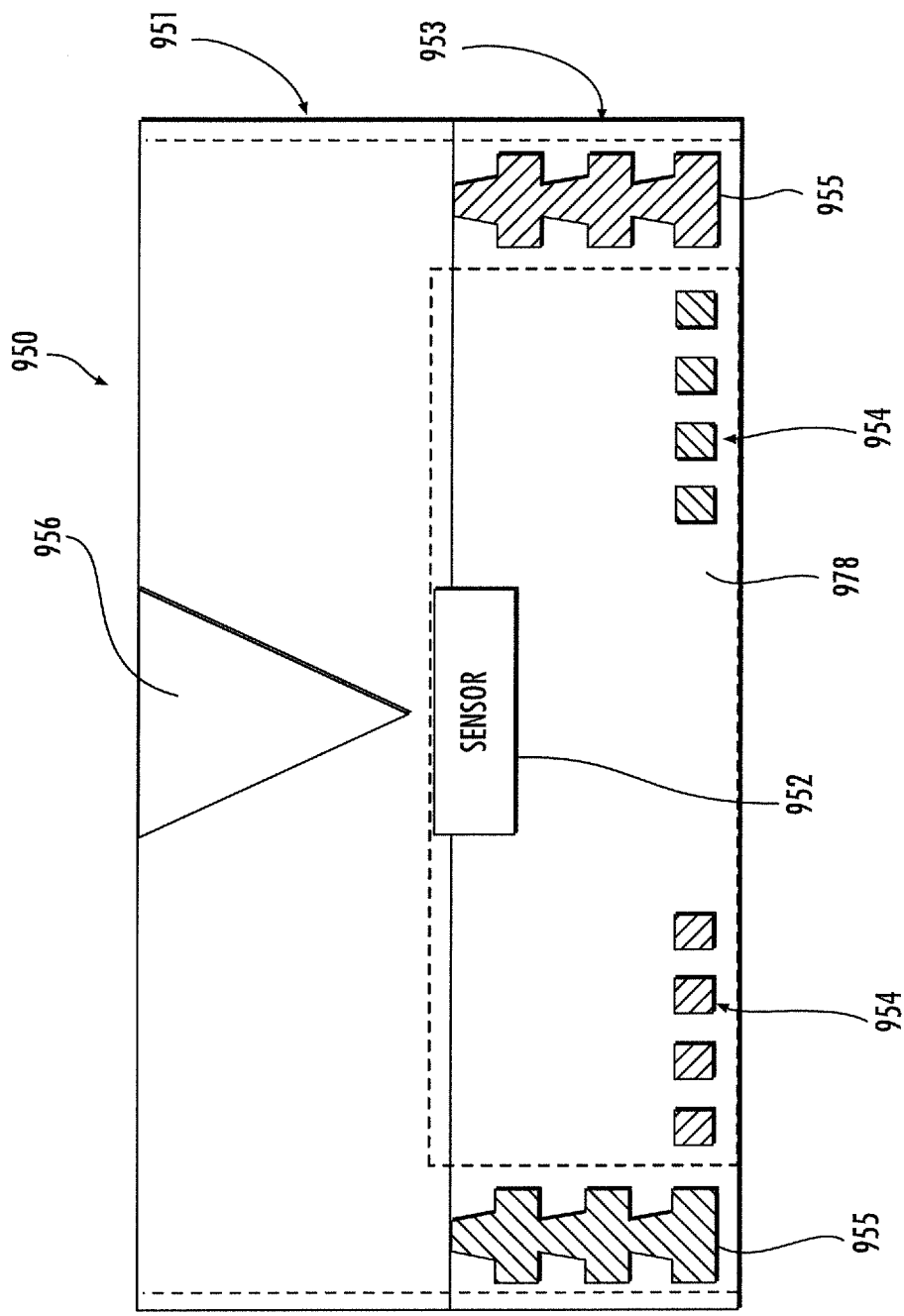
FIG. 19 is a schematic diagram of a cross-section view of yet another embodiment of an IC, according to the present disclosure.

Referring now additionally to FIG. 19, another embodiment of the IC 950 is now described. In this embodiment of the IC 950, those elements already discussed above with respect to FIGS. 1-3 are incremented by 900 and most require no further discussion herein. This embodiment differs from the previous embodiment in that this IC 950 illustratively includes the electrically insulating trench 956 extending vertically from the bottom surface of the semiconductor substrate 951 closed to a sensor, in particular, a pressure sensor, in the circuitry 952.

Also, the circuitry 952 illustratively includes a transceiver circuit and a pressure sensor circuit coupled thereto. In this embodiment, a trench recess is formed in the semiconductor substrate 951 using a potassium hydroxide (KOH) etching process and/or a Tetramethylammonium hydroxide (TMAH) etching process, for example. The formed trench recess is subsequently filled with an insulating material. The insulating material may be used to fine tune the characteristics of the pressure sensor circuit, particularly in piezo-resistivity embodiments, i.e. the elastic properties of the insulating material can be used to fine tune the bending of the semiconductor substrate 951 then increasing or reducing the maximum value that can be measured by pressure sensor. (See, e.g., U.S. Patent Application Publication No. 2013/0342186 to Pagani et al., assigned to the present application's assignee, the contents of which are hereby incorporated by reference in their entirety, which discloses a silicon crystal piezo-resistivity pressure sensor). Also, the electrically insulating trench 956 has a triangle-shaped cross-section.

Figure 20:
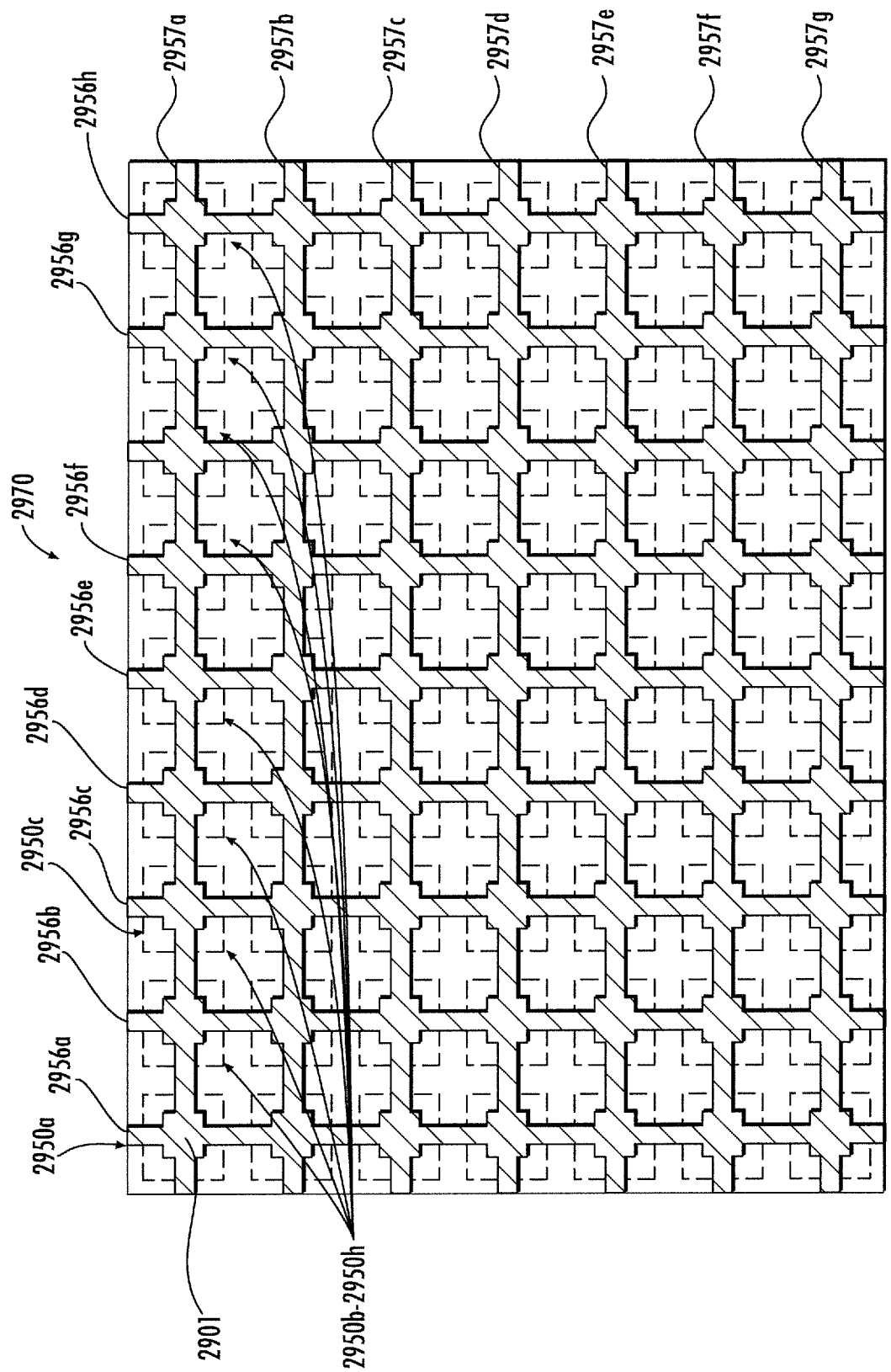
FIG. 20 is a top plan view of a wafer of another embodiment of ICs, according to the present disclosure.

Referring now additionally to FIG. 20, another embodiment of the wafer 2970 is now described. In this embodiment of the wafer 2970, those elements already discussed above with respect to FIGS. 1-3 are incremented by 2900 and most require no further discussion herein. This embodiment differs from the previous embodiment in that this wafer 2970 illustratively includes the plurality of ICs 2950a-2950h with cross-shaped electrically insulating trenches 2956a-2957g extending across the wafer 2970. In this embodiment, the electrically insulating grid includes at least a portion of the IC 2950a-2950h that is the cavity 2901 useful for the pressure sensor circuit. The cavity 2901 may be created at the intersections of electrically insulating trenches 2956a-2957g.

Figure 21:
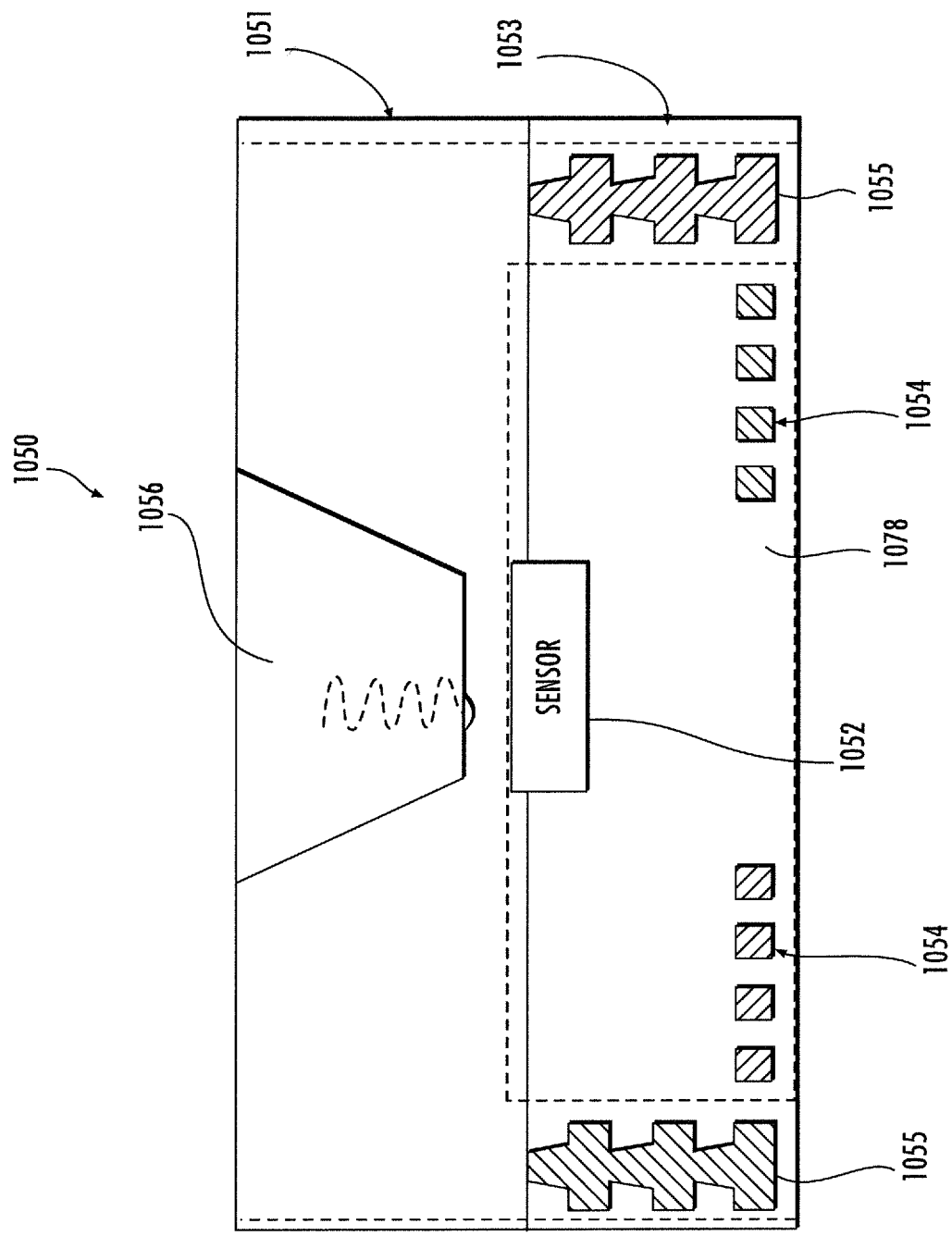
FIG. 21 is a schematic diagram of a cross-section view of another embodiment of an IC, according to the present disclosure.

Referring now additionally to FIG. 21, another embodiment of the IC 1050 is now described. In this embodiment of the IC 1050, those elements already discussed above with respect to FIGS. 1-3 are incremented by 1000 and most require no further discussion herein. This embodiment differs from the previous embodiment in that this IC 1050 illustratively includes the electrically insulating trench 1056 extending vertically from the bottom surface of the semiconductor substrate 1051. The electrically insulating trench 1056 also has a trapezoidal cross-section shape and has a spring-like action (noted with dashed lines).

Figure 22:
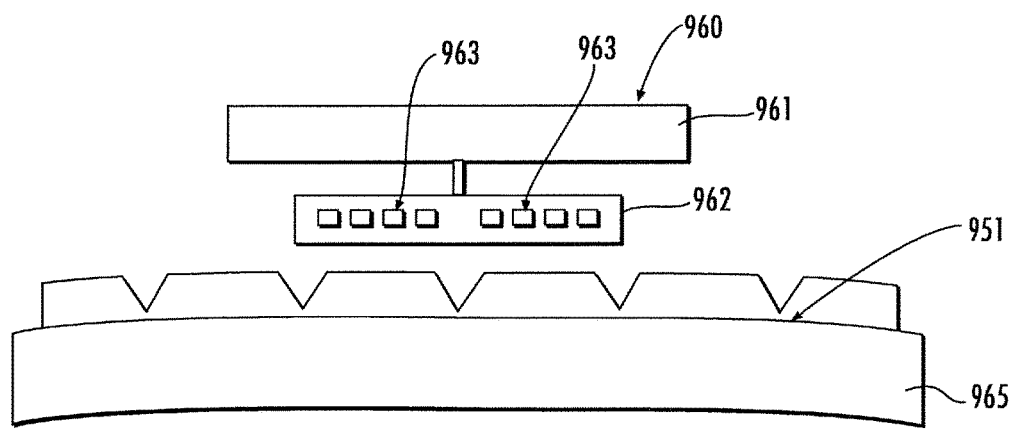
FIG. 22 is a schematic diagram of a cross-section view of a wafer under test, the wafer comprising a plurality of ICs of FIG. 19, according to the present disclosure.

Referring now additionally to FIG. 22, another embodiment of the ATE 960 is now described. In this embodiment of the ATE 960, those elements already discussed above with respect to FIGS. 1-3 are incremented by 900 and most require no further discussion herein. This embodiment differs from the previous embodiment in that this ATE 960 has a prober chuck 965 with a curved upper surface, such as a spherical or cylindrical surface, so as to bend the semiconductor substrate 951 to test pressure sensor functions. Advantageously, since the testing process is contactless, the antenna circuit board 962 can be planar yet still effective, and can easily follow the curved upper surface. In this embodiment, the prober chuck 965 may comprise, especially on its top surface, an insulating material, like ceramic, because the antennas (not shown) of ICs are closed to the upper surface of prober chuck 965.

Figure 23:
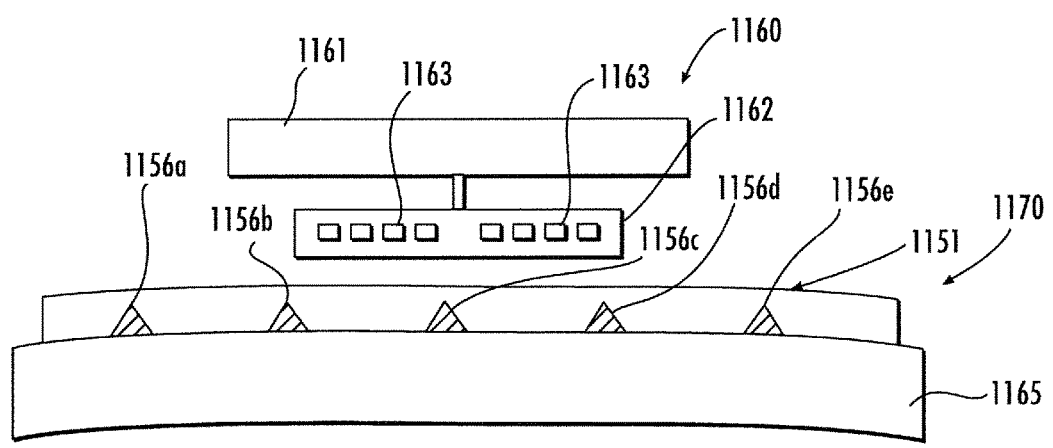
FIG. 23 is a schematic diagram of a cross-section view of a wafer under test, the wafer comprising a plurality of ICs, according to another embodiment of the present disclosure.

Referring now additionally to FIG. 23, another embodiment of the ATE 1160 is now described. In this embodiment of the ATE 1160, those elements already discussed above with respect to FIGS. 1-3 are incremented by 1100 and most require no further discussion herein. This embodiment differs from the previous embodiment in that this ATE 1160 has a prober chuck 1165 with a curved upper surface, and the antennas of the wafer are facing away from the antenna circuit board 1162. Also, in this embodiment, the wafer 1170 needs to have filled in trenches, to allow creation of a vacuum to retain it during testing.

Figure 24:
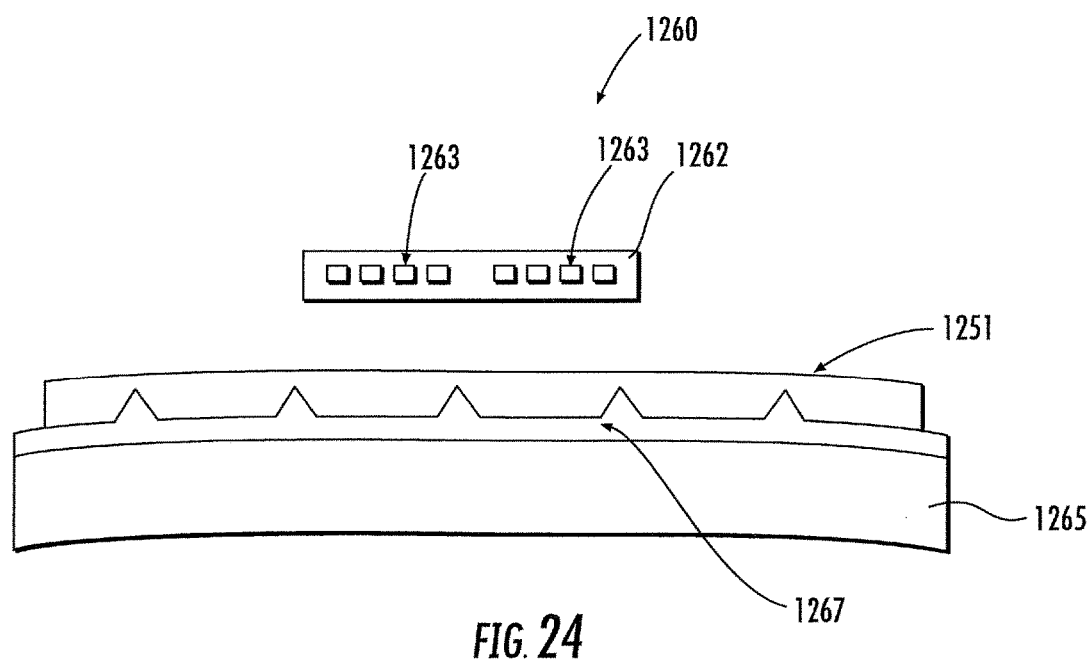
FIG. 24 is a schematic diagram of a cross-section view of a wafer under test, the wafer comprising a plurality of ICs, according to yet another embodiment of the present disclosure.

Referring now additionally to FIG. 24, another embodiment of the ATE 1260 is now described. In this embodiment of the ATE 1260, those elements already discussed above with respect to FIGS. 1-3 are incremented by 1200 and most require no further discussion herein. This embodiment differs from the previous embodiment in that this ATE 1260 has a prober chuck 1265 with a curved upper surface, and the antennas of the wafer are facing towards the antenna circuit board 1262. Also, the ATE 1260 illustratively includes a support layer 1267 on the prober chuck 1265 on bottom wafer surface where the insulating trench 1256 is not filled and then the support layer 1267, for example, a stick foil, which allows for creation of a vacuum to retain wafer 1270 during testing.

Figure 25:
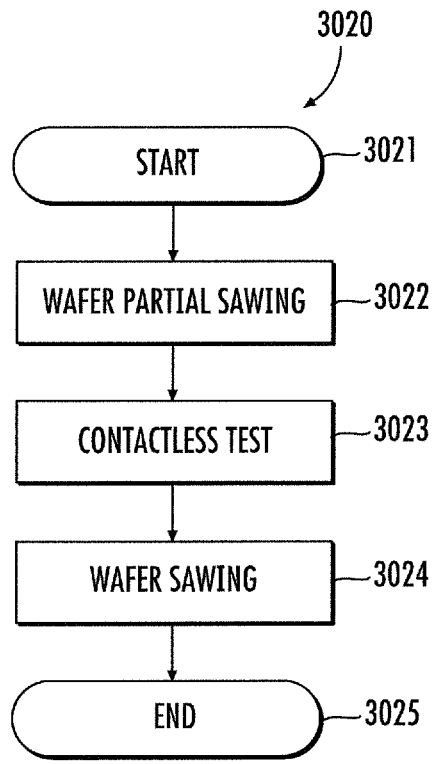
FIGS. 25-26 are flowcharts for methods for making embodiments of the IC, according to the present disclosure.
Figure 26:
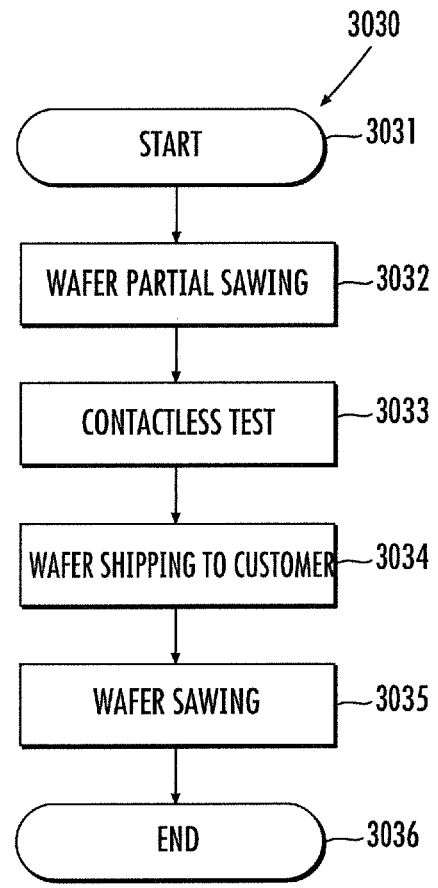
Figure 27:
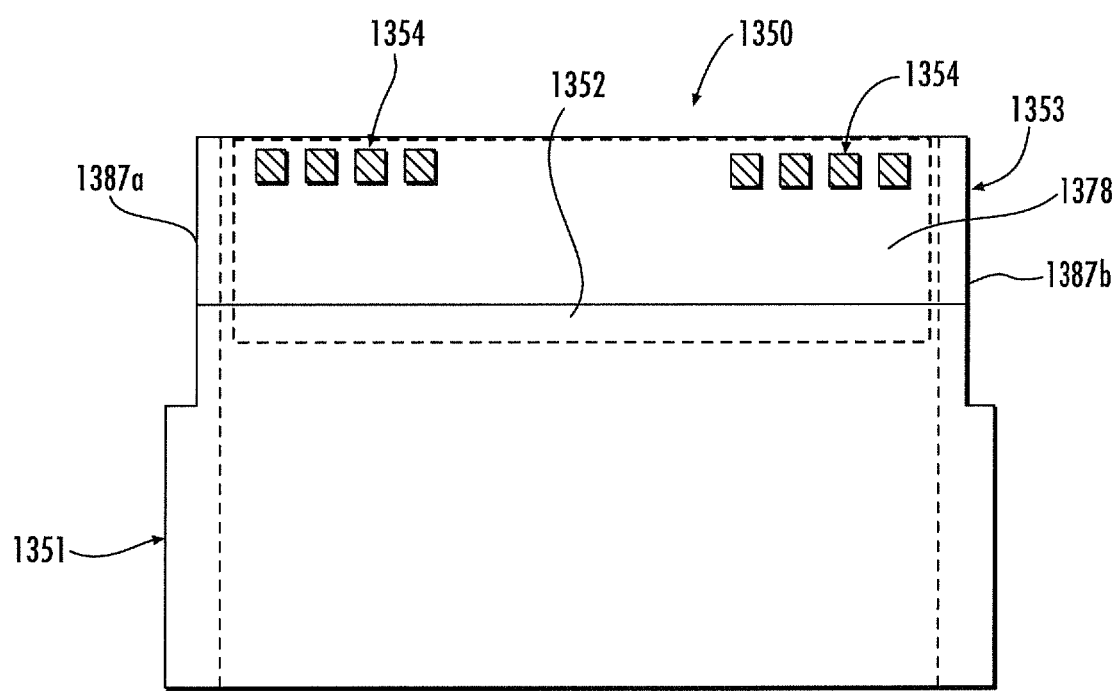
FIG. 27 is a schematic diagram of a cross-section view of another embodiment of the IC, according to the present disclosure.
Figure 30:
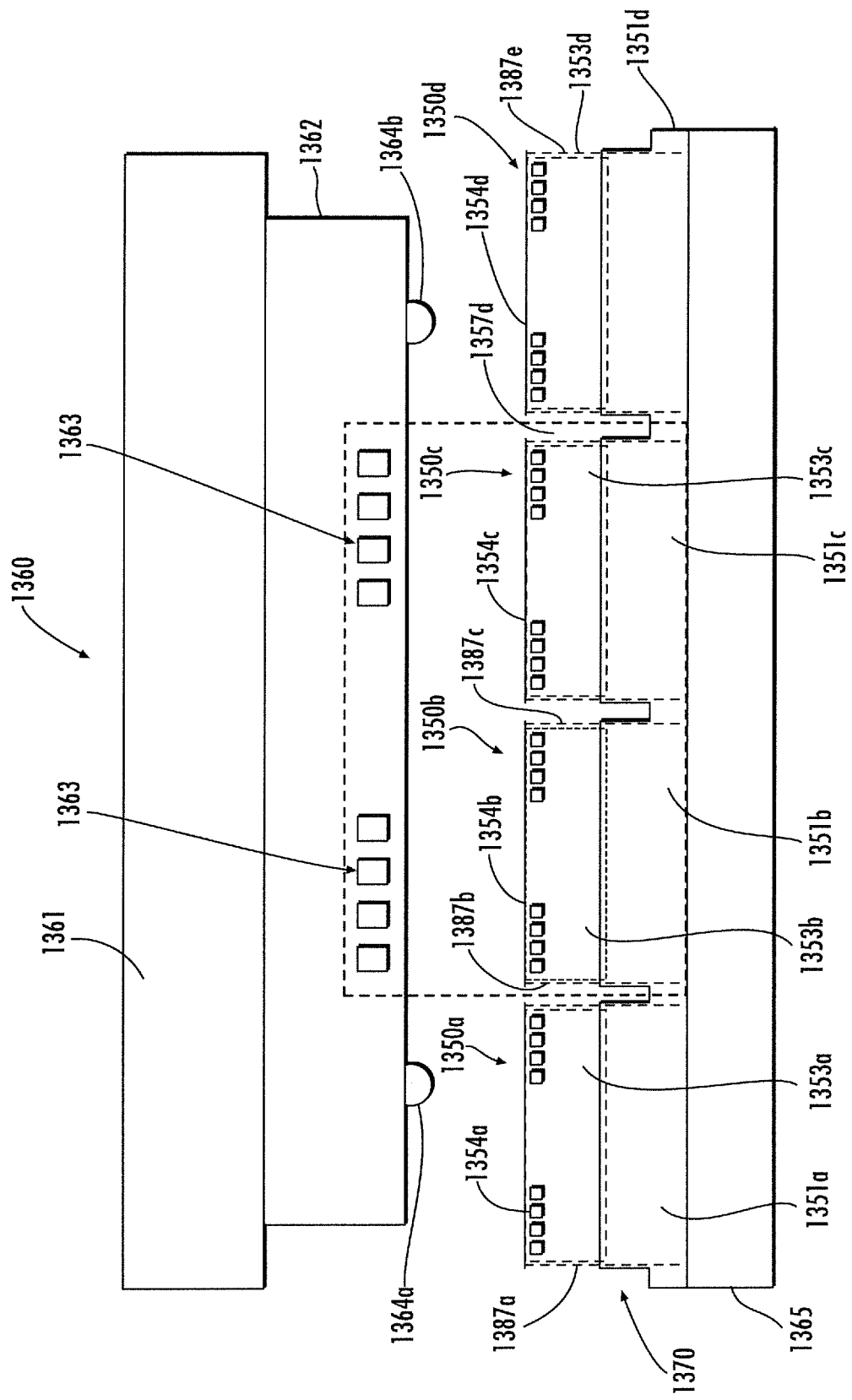
FIG. 30 is a schematic diagram of a cross-section view of the wafer from FIGS. 28-29 under test.

Referring to FIGS. 25-26, flowcharts 3020 & 3030 illustrate manufacturing process flows for the below embodiments. Flowchart 3020 shows a method comprising a wafer partial sawing step, a contactless test step, and a second wafer sawing step. (Blocks 3021-3025). Flowchart 3030 shows a method comprising a wafer partial sawing step, a contactless test step, a shipping step, and a second wafer sawing step. (Blocks 3031-3036). Some steps like wafer manufacturing step and assembly/packaging step may be omitted to simply flowcharts. Flowchart 3020 is suitable to create IC 1350 and flowchart 3030 is suitable to create IC 1750.

Referring now additionally to FIGS. 27-30, another embodiment of the IC 1350 and a method for making the IC are now described. In this embodiment of the IC 1350, those elements already discussed above with respect to FIGS. 1-3 are incremented by 1300 and most require no further discussion herein. This embodiment differs from the previous embodiment in that this IC 1350 illustratively includes stepped sides 1387a-1387b. In particular, the entire side portion of the interconnect layer 1353 and a portion of the semiconductor substrate 1351 are removed. The seal ring is not shown to simplify drawings.

In FIG. 28, the wafer 1370 is fixed to the support 1367, for example, using an adhesive layer. In FIG. 29, a mechanical blade 1376 is used to create recesses 1377a-1377e between the ICs 1350a-1350d to reduce eddy current. In this step, the mechanical blade 1376 only partially cuts the wafer 1370, for example, at a depth of 100 microns. Alternative embodiments may use laser or chemical etching rather than the mechanical blade 1376. The depth of the recesses 1377a-1377e may depend of the resistivity of semiconductor material of the semiconductor substrate 1351, i.e. the dopant concentration level of the semiconductor material. Before singulation, the wafer is subject to simultaneous testing of the ICs 1350a-1350d in FIG. 30 via the ATE 1360. Once testing is complete, a mechanical blade of reduced width is used to complete singulation of the ICs 1350a-1350d by continuing the cutting in the recesses 1377a-1377e.

Figure 31:
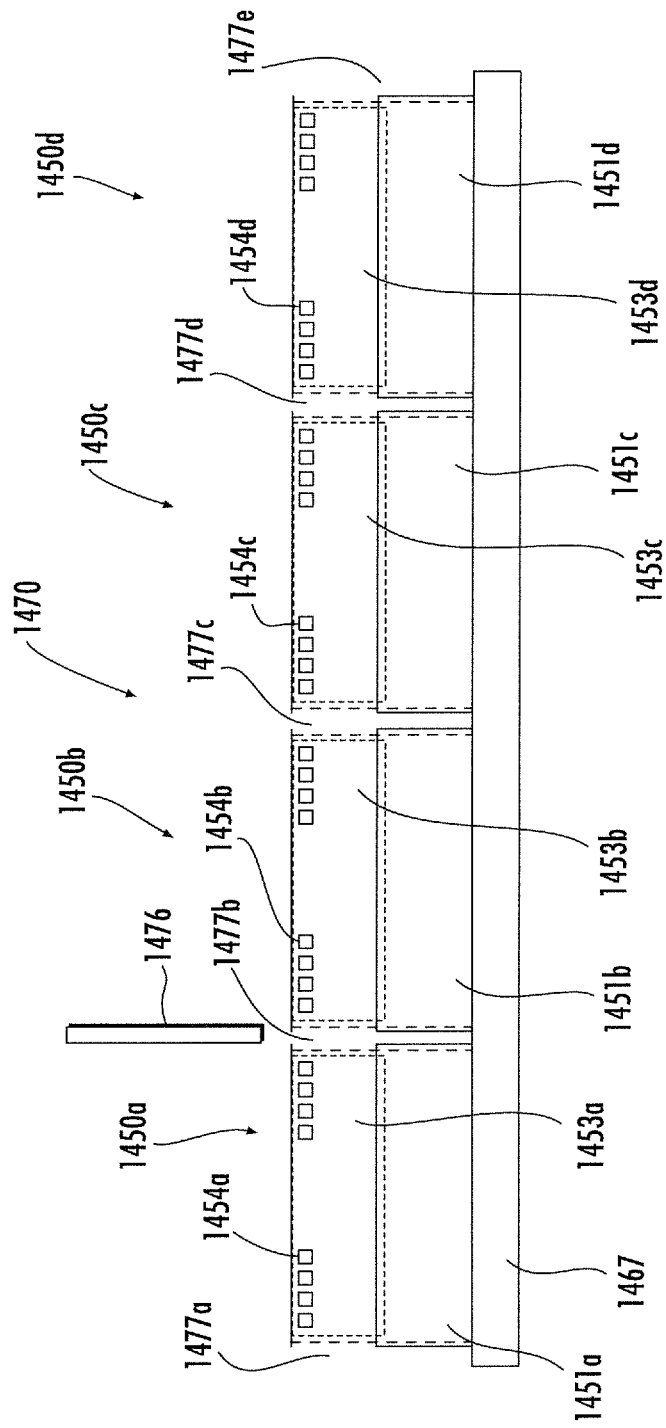
FIG. 31 is a schematic diagram of a cross-section view of a method for making a wafer comprising a plurality of ICs, according to another embodiment of the present disclosure.

Referring now additionally to FIG. 31, another embodiment of the IC 1450a-1450d and a method for making the IC are now described. In this embodiment of the IC 1450a-1450d, those elements already discussed above with respect to FIGS. 1-3 are incremented by 1400 and most require no further discussion herein. This embodiment differs from the previous embodiment in that this IC 1450a-1450d illustratively includes flush sides, defining flat side recesses 1477a-1477e. In this embodiment, only a single mechanical blade 1476 is used for singulation.

Referring now additionally to FIG. 32, another embodiment of the IC 1550a-1550d and a method for making the IC are now described. In this embodiment of the IC 1550a-1550d, those elements already discussed above with respect to FIGS. 1-3 are incremented by 1500 and most require no further discussion herein. This embodiment differs from the previous embodiment in that this IC 1550a-1550d illustratively includes a recess 1577a-1577d in the backside of the semiconductor substrate 1551, being created by a mechanical blade 1576.

Referring now additionally to FIG. 33, another embodiment of the IC 1650a-1650d and a method for making the IC are now described. In this embodiment of the IC 1650a-1650d, those elements already discussed above with respect to FIGS. 1-3 are incremented by 1600 and most require no further discussion herein. This embodiment differs from the previous embodiment in that this IC 1650a-1650d illustratively includes the recesses filled with electrically insulating material 1698a-1698d.

Figure 34:
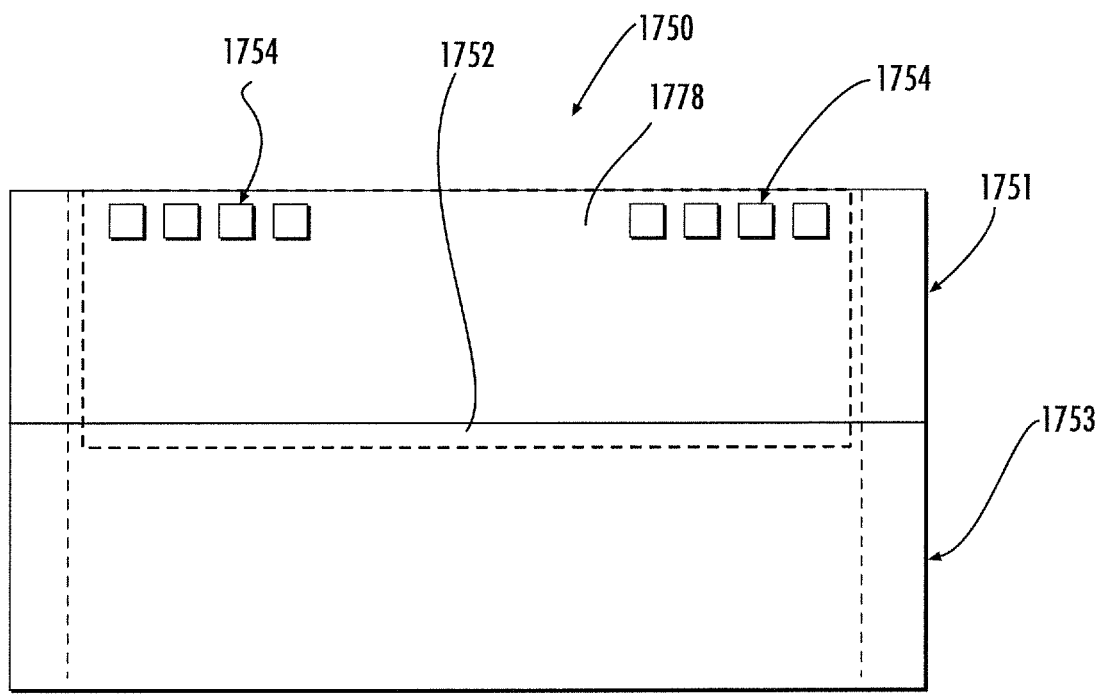
FIG. 34 is a schematic diagram of a cross-section view of another embodiment of an IC, according to the present disclosure.

Referring now additionally to FIGS. 34 and 38-39, another embodiment of the IC 1750 and a method for making the IC are now described. In this embodiment of the IC 1750, those elements already discussed above with respect to FIGS. 1-3 are incremented by 1700 and most require no further discussion herein. This embodiment differs from the previous embodiment in that this IC 1750 does not include the electrically insulating trench, and the seal ring is not shown to simplify the drawing.

Figure 40:
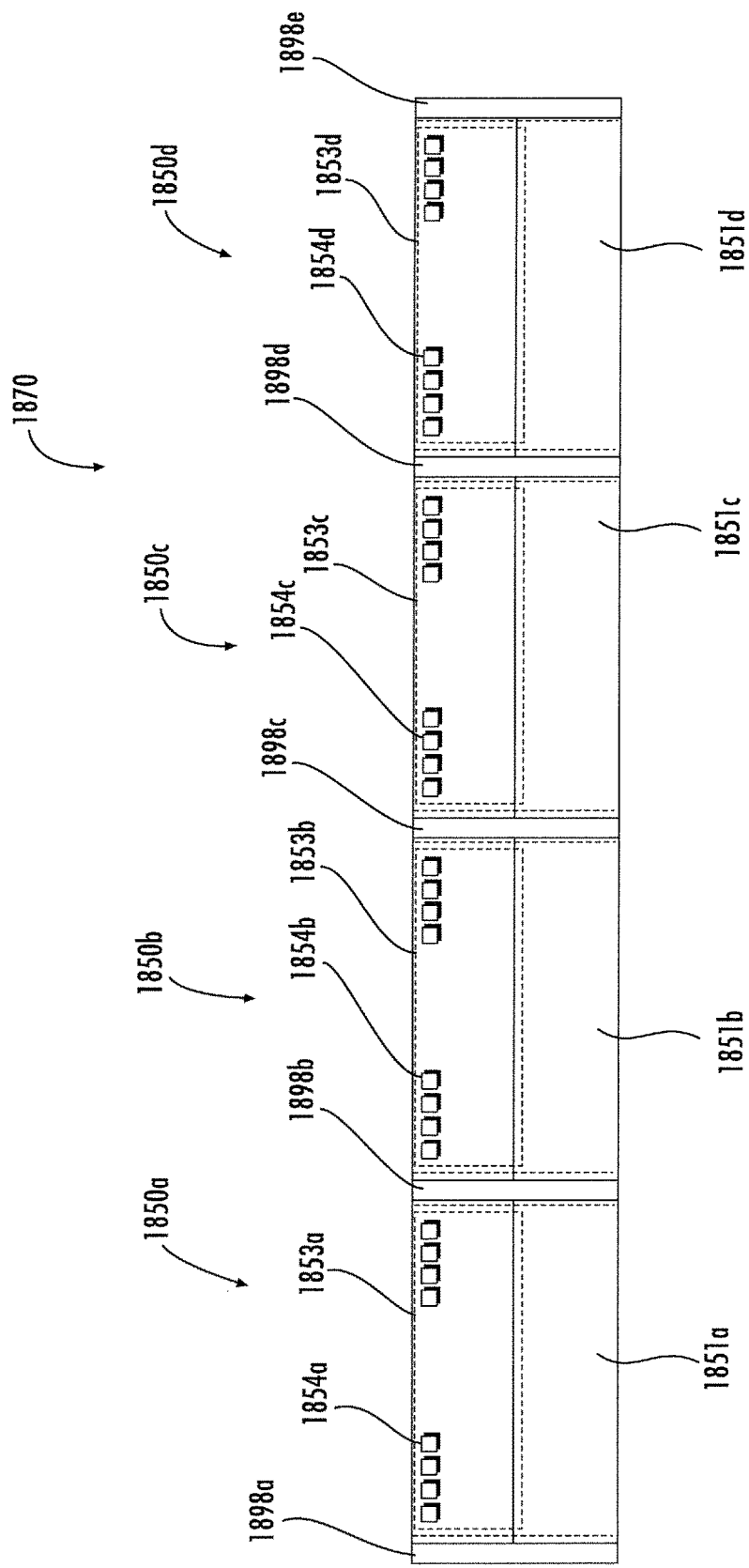
FIG. 40 is a schematic diagram of a cross-section view of a wafer comprising a plurality of ICs, according to another embodiment of the present disclosure.
Figure 41:
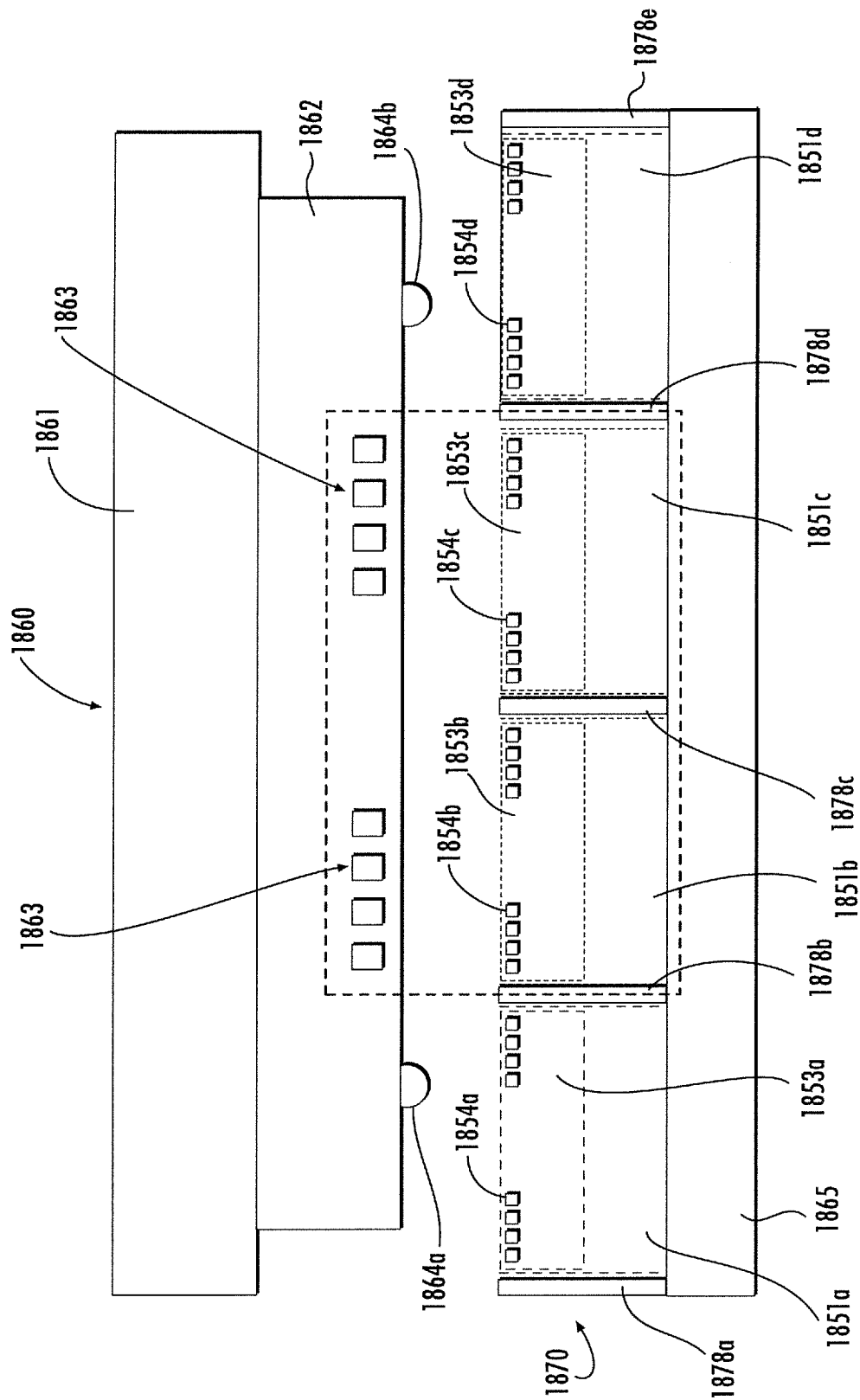
FIG. 41 is a schematic diagram of a cross-section view of the wafer of FIG. 40 under test.

Referring to FIGS. 35-37, flowcharts 3040, 3050, & 3060 illustrate manufacturing process flows for the below embodiments. Flowchart 3040 shows a method comprising a wafer manufacturing step, an electrical wafer sort step, an on-chip antenna forming step, a wafer sawing or partial sawing step, and a contactless test step. (Blocks 3041-3047). Flowchart 3050 shows a method comprising a wafer manufacturing step, an electrical wafer sort step, a wafer sawing or partial sawing step, and a contactless test step. (Blocks 3051-3056). Flowchart 3060 shows a method comprising a wafer manufacturing step, a wafer sawing or partial sawing step, and a contactless test step. (Blocks 3061-3065). For example, flowchart 3040 may be used to create IC 50', as shown in FIG. 4, with or without electrically insulating trenches 56', flowchart 3050-3060 may be used to create IC 50, 50b", 450a, 750a, 850a, that are created with or without electrically insulating trenches Referring now additionally to FIGS. 40-41, another embodiment of the IC 1850a-1850d under test is now described. In this embodiment of the IC 1850a-1850d, those elements already discussed above with respect to FIGS. 1-3 are incremented by 1800 and most require no further discussion herein. This embodiment differs from the previous embodiment in that this IC 1850a-1850d illustratively includes the recesses filled with electrically insulating material 1898a-1898e. In particular the method for making the IC 1850a-1850d is the same as shown in FIGS. 38-39 with the additional recess filling step. The ICs 1850a-1850d are completely separated and isolated among them and it drastically reduces eddy current. If the electrically insulating material 1898a-1898e is a polymer, a flexible wafer or wafer portion is achieved and all ICs 1850a-1850d are surrounded by an elastic frame created with the electrically insulating material 1898a-1898e.

Figure 42:
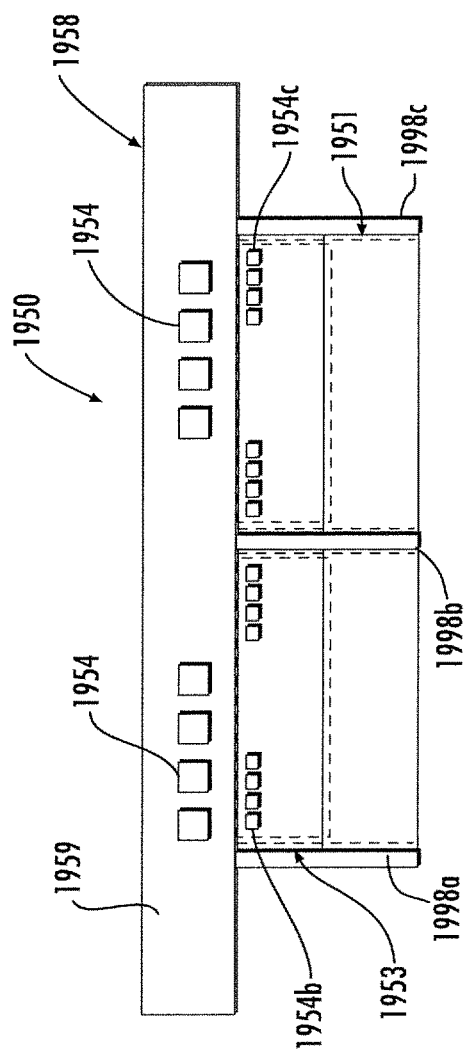
FIGS. 42-43 are schematic diagrams of a cross-section view of other embodiments of an IC, according to the present disclosure.

Referring now additionally to FIG. 42, another embodiment of the IC 1950 is now described. In this embodiment of the IC 1950, those elements already discussed above with respect to FIGS. 1-3 are incremented by 1900 and most require no further discussion herein. This embodiment differs from the previous embodiment in that this IC 1950 illustratively includes first and second ICs coupled together via electrically insulating material 1998b, and with electrically insulating material on opposing ends 1998a, 1998c. The antennas 1954b-1954c of IC 1950 are electromagnetically coupled to the antenna 1954a in the additional circuit board layer 1958. The additional circuit board layer 1958 can be a portion of an electromagnetic expansion/concentrator that supply power and allow communication signal exchange between IC 1950 and other systems, here not shown (See, e.g., U.S. Patent Application Publication No. 2013/0342186 to Pagani et al., assigned to the present application's assignee, the contents of which are hereby incorporated by reference in their entirety, which discloses an electromagnetic expansion and concentration device).

Figure 43:
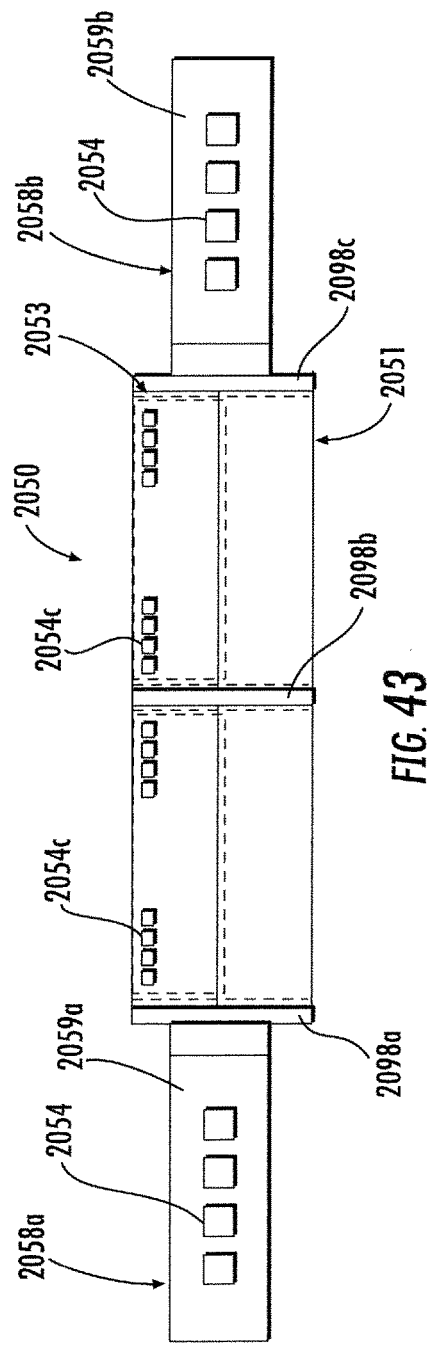

Referring now additionally to FIG. 43, another embodiment of the IC 2050 is now described. In this embodiment of the IC 2050, those elements already discussed above with respect to FIGS. 1-3 are incremented by 2000 and most require no further discussion herein. This embodiment differs from the previous embodiment in that this IC 2050 illustratively includes first and second ICs 2050a-2050b mechanically coupled together via electrically insulating material 2098b, and eventually with electrically insulating material on opposing ends 2098a, 2098c. The IC 2050 illustratively includes first and second additional circuit board layer portions 2058a-2058b flanking the ICs with an antenna 2054 therein. The ICs 2050a-2050b are redundant, and improve system reliability and lifetime in case there will be a failure of one of them.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An integrated circuit (IC) comprising:
a semiconductor substrate comprising a top surface and an opposite bottom surface, the semiconductor substrate comprising circuitry formed at the top surface;
a dielectric layer disposed above said semiconductor substrate;
an antenna disposed in the dielectric layer, the antenna being coupled to said circuitry;
a seal ring comprising a metal disposed around a periphery of the dielectric layer, the seal ring disposed, around the antenna and the circuitry, in the dielectric layer above the semiconductor substrate; and
at least one electrically insulating trench comprising a solid-state insulating material, the at least one electrically insulating trench extending vertically into said semiconductor substrate and extending laterally across said IC from adjacent one side to adjacent another side thereof, wherein the circuitry and the antenna are integrated on the semiconductor substrate to form the IC.

2. The IC of claim 1, wherein said at least one electrically insulating trench extends laterally from one side edge to another side edge of said IC.

3. The IC of claim 1, wherein said circuitry comprises a transceiver circuit and a pressure sensor circuit coupled to the transceiver circuit.

4. The IC of claim 1, wherein said at least one electrically insulating trench comprises a plurality of electrically insulating trenches.

5. The IC of claim 1, wherein said at least one electrically insulating trench comprises a plurality of intersecting electrically insulating trenches.

6. The IC of claim 1, wherein said at least one electrically insulating trench extends vertically from the top surface of said semiconductor substrate.

7. The IC of claim 1, wherein said at least one electrically insulating trench extends vertically from the bottom surface of said semiconductor substrate.

8. The IC of claim 1, wherein said at least one electrically insulating trench has tapered sidewalls.

9. The IC of claim 1, wherein said seal ring comprises a continuous electrically conductive ring.

10. The IC of claim 1, wherein said seal ring comprises a non-continuous electrically conductive ring.

11. The IC of claim 1, further comprising a passivation layer over dielectric layer.

12. The IC of claim 1, wherein the antenna is disposed over the circuitry and comprises coils disposed around a central region, and wherein the trench is disposed directly under the central region.

13. The IC of claim 1, wherein the antenna is disposed over the circuitry, and wherein the trench is part of an insulating grid of trenches disposed under the antenna in the semiconductor substrate.

14. An semiconductor chip comprising:
a semiconductor substrate comprising a top surface and an opposite bottom surface;
circuitry disposed at the top surface;
an interconnect layer disposed over the semiconductor substrate;
an antenna disposed in the interconnect layer, the antenna being coupled to the circuitry;
a seal ring disposed around a periphery of the interconnect layer; and
a plurality of trench segments comprising a solid-state insulating material, the plurality of trench segments extending vertically into the semiconductor substrate, the plurality of trench segments being arranged in a pattern, wherein a first one of the plurality of trench segments oriented along a first direction intersects with a first side edge of the semiconductor chip and a second one of the plurality of trench segments oriented along a second direction intersects with a second side edge different from the first side edge, the first direction being different from the second direction, the first and the second ones of the plurality of trench segments intersecting with each other in an interior region of the semiconductor chip.

15. The semiconductor chip of claim 14, wherein each of the plurality of trench segments comprise a L-shaped trench, a T-shaped trench, or a cross-shaped trench.

16. The semiconductor chip of claim 14, wherein the antenna is disposed over the circuitry and comprises coils disposed around a central region, and wherein the one of the plurality of trench segments disposed in the interior region is directly under the central region.

17. The semiconductor chip of claim 14, wherein the antenna is disposed over the circuitry, and wherein the plurality of trench segments form an insulating grid disposed under the antenna in the semiconductor substrate, the insulating grid configured to prevent eddy currents in the semiconductor substrate.

18. The IC of claim 1, wherein the antenna has a smaller footprint than the semiconductor substrate and overlaps with the semiconductor substrate completely.

19. A semiconductor die comprising:
- a semiconductor substrate comprising a top surface and an opposite bottom surface, the semiconductor substrate comprising a circuitry formed at the top surface, the circuitry comprising a pressure sensor circuit;
- a dielectric layer disposed over the semiconductor substrate;
- an antenna disposed in the dielectric layer, the antenna being coupled to the circuitry;
- a seal ring comprising a metal disposed in the dielectric layer, the seal ring disposed around the antenna and the circuitry within the dielectric layer, the seal ring and antenna sharing a common metallization layer; and
- a first insulating trench comprising a solid-state insulating material, the first electrically insulating trench extending vertically into the semiconductor substrate and extending laterally across the semiconductor die from a first sidewall of the semiconductor substrate to an opposite second sidewall of the semiconductor substrate; and
- a passivation layer disposed over the dielectric layer, the semiconductor die comprising the circuitry, the antenna, the seal ring, the passivation layer are integrated on the same semiconductor substrate to form an integrated circuit.

20. The IC of claim 19, wherein the antenna has a smaller footprint than the semiconductor substrate and overlaps with the semiconductor substrate completely.

21. A semiconductor die comprising:
- a semiconductor substrate comprising a top surface and an opposite bottom surface, the semiconductor substrate comprising remaining portions of a scribe line surrounding a circuitry formed at the top surface, the semiconductor substrate comprising a first sidewall, a second sidewall opposite to the first sidewall, a third sidewall, and a fourth sidewall opposite to the third sidewall, wherein the first, the second, the third, and the fourth sidewalls comprise the remaining portions of a scribe line;
- a dielectric layer disposed over the semiconductor substrate;
- an antenna disposed in the dielectric layer, the antenna being coupled to the circuitry;
- a seal ring comprising a metal disposed in the dielectric layer, the seal ring disposed around the antenna and the circuitry within the dielectric layer, the seal ring and antenna sharing a common metallization layer; and
- an insulating grid comprising a plurality of insulating trenches comprising a solid-state insulating material, wherein each of the plurality of insulating trenches of the insulating grid extends vertically into the semiconductor substrate and extends laterally across the semiconductor die to directly contact the first, the second, the third, or the fourth sidewall, wherein each of the first, the second, the third, and the fourth sidewalls directly contacts the insulating grid; and
- a passivation layer disposed over the dielectric layer, the semiconductor die comprising the circuitry, the antenna, the seal ring, the passivation layer are integrated on the same semiconductor substrate to form an integrated circuit.

22. The IC of claim 21, wherein the antenna has a smaller footprint than the semiconductor substrate and overlaps with the semiconductor substrate completely.

* * * * *